(12) United States Patent
Locascio et al.

(10) Patent No.: US 8,456,250 B2
(45) Date of Patent: *Jun. 4, 2013

(54) METHODS AND APPARATUS FOR TUNING DEVICES HAVING RESONATORS

(75) Inventors: David Locascio, Chandler, AZ (US); Reimund Rebel, Maricopa, AZ (US); Jan H. Kuypers, Cambridge, MA (US)

(73) Assignee: Sand 9, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/830,056

(22) Filed: Jul. 2, 2010

(65) Prior Publication Data
US 2010/0315170 A1 Dec. 16, 2010

Related U.S. Application Data

(63) Continuation-in-part of application No. 12/699,094, filed on Feb. 3, 2010.

(60) Provisional application No. 61/149,815, filed on Feb. 4, 2009, provisional application No. 61/184,138, filed on Jun. 4, 2009.

(51) Int. Cl.
*H03B 5/30* (2006.01)
*H03B 5/32* (2006.01)

(52) U.S. Cl.
CPC . *H03B 5/326* (2013.01); *H03B 5/30* (2013.01)
USPC ............... 331/107 A; 331/116 R; 331/116 M; 331/154

(58) Field of Classification Search
CPC . H03B 5/326; H03B 5/323; H03B 5/32; H03B 5/30; H03B 5/20; H03B 5/366; H03B 5/368
USPC .................. 331/116 R, 116 FE, 116 M, 154, 331/155, 156, 158, 135, 107 A
See application file for complete search history.

(56) References Cited

U.S. PATENT DOCUMENTS 4,503,434 A 3/1985 Luh
4,521,702 A 6/1985 Kleinberg
(Continued)

FOREIGN PATENT DOCUMENTS

EP 0375360 A2 6/1990
EP 1505722 A2 2/2005
(Continued)

OTHER PUBLICATIONS

Liu, "A 2.7-V Dual-Frequency Single-Sideband Mixer", VLSI Circuits, 1998 Digest of Technical Papers, 1998 Symposium on, Jun. 11-13, 1998, pp. 124-127.*

(Continued)

*Primary Examiner* — Ryan Johnson
(74) *Attorney, Agent, or Firm* — Wolf, Greenfield & Sacks, P.C.

(57) ABSTRACT

Methods and apparatus for tuning devices having resonators are described. Phase shifters are included in the circuits and used to shift the phase of the output signal(s) of the resonators. In some implementations, the phase shifters are configured in a feedback loop with the resonators. One or more of the apparatus described herein may be implemented as part, or all, of a microelectromechanical system (MEMS).

28 Claims, 17 Drawing Sheets

U.S. PATENT DOCUMENTS

| | | | |
|---|---|---|---|
| 4,581,592 | A | 4/1986 | Bennett |
| 5,416,447 | A | 5/1995 | Andres et al. |
| 5,874,866 | A | 2/1999 | Satoh et al. |
| 5,914,553 | A | 6/1999 | Adams et al. |
| 5,939,918 | A | 8/1999 | McGarry et al. |
| 5,939,956 | A | 8/1999 | Arimura et al. |
| 6,124,765 | A | 9/2000 | Chan et al. |
| 6,577,040 | B2 | 6/2003 | Nguyen |
| 6,739,190 | B2 | 5/2004 | Hsu et al. |
| 6,741,147 | B2 | 5/2004 | Harris |
| 6,828,713 | B2 | 12/2004 | Bradley et al. |
| 6,831,531 | B1 | 12/2004 | Giousouf et al. |
| 6,859,113 | B2 | 2/2005 | Giousouf et al. |
| 6,909,221 | B2 | 6/2005 | Ayazi et al. |
| 6,914,493 | B2 * | 7/2005 | Ash ............ 331/107 A |
| 6,943,484 | B2 | 9/2005 | Clark et al. |
| 6,954,020 | B2 | 10/2005 | Ma et al. |
| 6,995,622 | B2 | 2/2006 | Partridge et al. |
| 7,005,946 | B2 | 2/2006 | Duwel et al. |
| 7,092,687 | B2 | 8/2006 | Krupezevic et al. |
| 7,187,240 | B2 | 3/2007 | Cathelin et al. |
| 7,211,926 | B2 | 5/2007 | Quevy et al. |
| 7,215,061 | B2 | 5/2007 | Kihara et al. |
| 7,248,128 | B2 | 7/2007 | Mattila et al. |
| 7,352,608 | B2 | 4/2008 | Mohanty et al. |
| 7,492,241 | B2 | 2/2009 | Piazza et al. |
| 7,504,909 | B2 | 3/2009 | Tada |
| 7,724,103 | B2 | 5/2010 | Feng et al. |
| 7,791,432 | B2 | 9/2010 | Piazza et al. |
| 7,932,789 | B2 | 4/2011 | Hay |
| 7,932,798 | B2 | 4/2011 | Tolle et al. |
| 2002/0075100 | A1 | 6/2002 | Katohno |
| 2002/0158700 | A1 | 10/2002 | Nemoto |
| 2003/0034852 | A1 | 2/2003 | Kobayashi et al. |
| 2004/0056728 | A1 * | 3/2004 | Dent et al. ............ 331/158 |
| 2005/0073078 | A1 | 4/2005 | Lutz et al. |
| 2006/0255884 | A1 | 11/2006 | Tanaka |
| 2007/0052324 | A1 | 3/2007 | Chen et al. |
| 2008/0048804 | A1 | 2/2008 | Volatier et al. |
| 2008/0143217 | A1 | 6/2008 | Ho et al. |
| 2008/0204153 | A1 | 8/2008 | Yoshida et al. |
| 2008/0272852 | A1 | 11/2008 | Six |
| 2009/0026882 | A1 | 1/2009 | Steeneken et al. |
| 2009/0108381 | A1 | 4/2009 | Buchwalter et al. |
| 2009/0108959 | A1 | 4/2009 | Piazza et al. |
| 2009/0144963 | A1 | 6/2009 | Piazza et al. |
| 2009/0243747 | A1 | 10/2009 | Gaidarzhy et al. |
| 2009/0273404 | A1 * | 11/2009 | Hay ............ 331/107 A |
| 2009/0294638 | A1 | 12/2009 | Mohanty et al. |
| 2010/0007443 | A1 | 1/2010 | Mohanty et al. |
| 2010/0134207 | A1 | 6/2010 | Mohanty et al. |
| 2010/0155883 | A1 | 6/2010 | Wenzler et al. |
| 2010/0181868 | A1 | 7/2010 | Gaidarzhy et al. |

FOREIGN PATENT DOCUMENTS

| | | |
|---|---|---|
| WO | WO 98/01948 A1 | 1/1998 |
| WO | WO 98/37635 A1 | 8/1998 |
| WO | WO 02/17481 A2 | 2/2002 |
| WO | WO 2005/029700 A1 | 3/2005 |
| WO | WO 2006/000611 A1 | 1/2006 |
| WO | WO 2006/083482 A2 | 8/2006 |
| WO | WO 2010/011288 A1 | 1/2010 |
| WO | WO 2010/077311 A1 | 7/2010 |
| WO | WO 2010/090731 A2 | 8/2010 |

OTHER PUBLICATIONS

Humad et al., "High frequency micromechanical piezo-on-silicon block resonators," Int'l Electron Devices Meeting 2003 IEDM. Technical Digest, Washington, D.C. Dec. 8-10, 2003, New York, NY: IEEE US Dec. 8, 2003, pp. 957-960.

International Search Report and International Preliminary Report on Patentability for PCT/US2006/021298 mailed Nov. 6, 2006 and Dec. 6, 2007 respectively.

Piazza et al., "Low motional resistance ring-shaped contour-mode aluminum nitride piezoelectric micromechanical resonators for UHF applications," Micro Electro Mechanical Systems, 2005. MEMS 2005. 18$^{th}$ IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an AlN/Si Structure," Proceedings Ultrasonics Symposium, Oct. 31, 1993-Nov. 3, 1993, Baltimore, MD, IEEE 1993 vol. 1, pp. 371-374.

Driscoll, M.M., "Linear Frequency Tuning of Saw Resonators," *IEEE Trans. on Ultrasonics, Ferroelectrics and Frequency Control*, 38(4):366-369 (1991).

Driscoll et al., "Voltage-Controlled Crystal Oscillators," *IEEE Trans. On Electron Devices*, ED18(8):528-535 (1971).

International Search Report and Written Opinion for International Application No. PCT/US2010/000301 mailed Sep. 3, 2010.

International Search Report and Written Opinion for International Application No. PCT/US09/06587 mailed Feb. 26, 2010.

International Search Report from PCT/US2011/042777, mailed Oct. 21, 2011.

* cited by examiner

METHODS AND APPARATUS FOR TUNING DEVICES HAVING RESONATORS

RELATED APPLICATIONS

The present application claims the benefit under 35 U.S.C. §120 as a continuation-in-part of U.S. patent application Ser. No. 12/699,094, filed Feb. 3, 2010 and entitled "Methods and Apparatus For Tuning Devices Having Mechanical Resonators", which is hereby incorporated herein by reference in its entirety. U.S. patent application Ser. No. 12/699,094 claims the benefit under 35 U.S.C. §119(e) of U.S. Provisional Patent Application No. 61/149,815, filed on Feb. 4, 2009, and entitled "Methods and Apparatus for Tuning Oscillators", which is hereby incorporated herein by reference in its entirety. U.S. patent application Ser. No. 12/699,094 also claims the benefit under 35 U.S.C. §119(e) of U.S. Provisional Patent Application No. 61/184,138, filed on Jun. 4, 2009, and entitled "Methods and Apparatus for Tuning Devices Having Mechanical Resonators", which is hereby incorporated herein by reference in its entirety.

BACKGROUND

1. Field

The technology described herein relates to methods and apparatus for tuning devices having resonators.

2. Related Art

Some electromechanical oscillators include a mechanical resonator coupled to an electronic driving circuit. The mechanical resonator has an inherent resonance frequency, the value of which depends on factors such as the size, shape, and material of the resonator. The electronic driving circuit produces a drive signal to drive the mechanical resonator.

A mechanical resonator, such as those used in some electromechanical oscillators, may be designed to have a desired resonance frequency. In particular, because the inherent resonance frequency of the mechanical resonator is determined, at least partially, by factors that are subject to design choice (i.e., size, shape, material, etc.), the mechanical resonator may be designed to have a desired resonance frequency by suitably designing those factors. However, due to manufacturing tolerances resulting in deviations of the design factors from their intended values, and due to variations arising during operation of the electromechanical oscillator (for example, temperature induced variations, ambient pressure variations, package-induced stress, material dependent stress), the mechanical resonator may not have the desired inherent resonance frequency in all situations.

To account for manufacturing tolerances and temperature induced shifts in the resonance frequency of the mechanical resonator, the electromechanical oscillator may be tuned. FIG. 1 illustrates a characteristic impedance curve of a resonator as a function of frequency, which curve is applicable to the mechanical resonators of typical electromechanical oscillators. The impedance is illustrated by line 102, and includes both a series resonance peak 104, occurring at a resonance frequency $f_{res}$, and a parallel resonance peak 106. In the case of electromechanical oscillators having a mechanical resonator, conventional tuning methods allow for tuning of the oscillator operation within a tuning range 108 between the series resonance peak and the parallel resonance peak. Because the conventional tuning range 108 occurs on only one side of the series resonance frequency, $f_{res}$, the accuracy of tuning of the oscillator around the series resonance frequency of the mechanical resonator is limited.

SUMMARY

According to one aspect of the technology, a method of tuning a device having a mechanical resonator is provided. The method comprises receiving an output signal of the mechanical resonator, producing a phase-shifted signal from the output signal, and inputting the phase-shifted signal to the mechanical resonator.

According to another aspect of the technology, a device is provided comprising a mechanical resonator and a processing circuit. The processing circuit is coupled to the mechanical resonator and configured to receive an output signal of the mechanical resonator, produce a phase-shifted signal shifted in phase relative to the output signal, and provide the phase-shifted signal to an input of the mechanical resonator.

According to another aspect of the technology, a device is provided comprising a differential mechanical resonator configured to produce a differential output signal and a processing circuit. The processing circuit is coupled to the differential mechanical resonator and is configured to receive the differential output signal, generate a phase-shifted differential signal, and provide the phase-shifted differential signal to a differential input of the differential mechanical resonator.

According to another aspect, a phase shifter is provided. The phase shifter comprises a first input port and a second input port. The first and second input ports are configured to receive a differential input signal. The phase shifter further comprises three output ports configured to provide three respective output signals of substantially equal amplitude and different phase.

DETAILED DESCRIPTION

Figure 1:
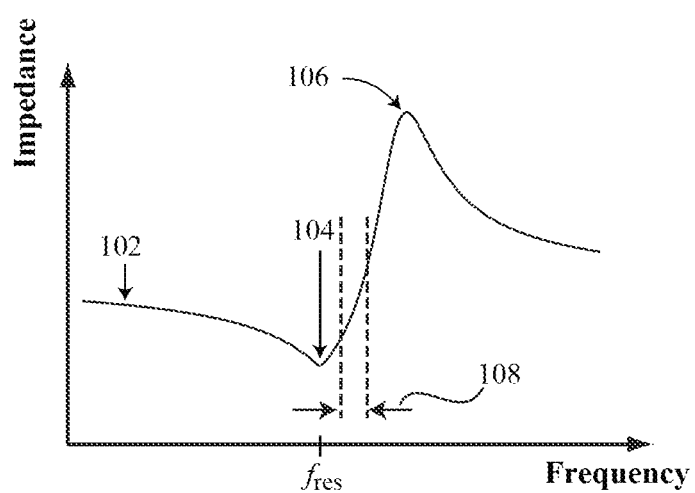
FIG. 1 shows an impedance curve for a resonator, and illustrates that conventional tuning methods allowed for tuning on only one side of the series resonance peak.

Applicant describes below tunable electromechanical devices having resonators, some of which may be mechanical resonators. Some of the electromechanical devices described implement a phase shifter as a tuner to provide tuning capability, and others implement a tuning subcircuit formed of inductors and/or capacitors as a tuner. At least some of the devices may offer greater tuning flexibility and capability than that of conventional electromechanical oscillators, for example in that they may be tuned to exhibit resonant behavior below and above the series resonance frequency of the resonator.

According to one aspect of the technology described herein, an electromechanical device (e.g., an oscillator, a filter, a sensor, or other type of device) has a mechanical resonator that has a series resonance frequency, and the device is configured to allow for tuning of the device's frequency of operation on both sides of the series resonance frequency of the mechanical resonator. Thus, devices having mechanical resonators may be tuned to exhibit resonant behavior at a desired frequency even though the inherent resonance frequency of the mechanical resonator may not be equal to the desired resonance frequency, either because of manufacturing errors, temperature variations, or for any other reason (e.g., ambient pressure variations, package-induced stresses, or material-dependent stresses, among others). As a result, the need for strict manufacturing tolerances of the mechanical resonator may be relaxed, since the device may be accurately tuned to compensate for any deviations of the inherent resonance frequency of the mechanical resonator from the desired resonance frequency.

According to one embodiment, a device having a mechanical resonator includes a phase shifter configured to shift the phase of the input signal(s) to and/or output signal(s) from the mechanical resonator. In some embodiments the mechanical resonator is configured in a feedback loop, for example with the phase shifter, and inducing a phase difference between the input signal(s) and output signal(s) of the mechanical resonator operating at a first frequency may cause the mechanical resonator to shift its operation to a second frequency. By suitably selecting the amount of phase shift induced, the device may be operated to exhibit resonant behavior at a desired resonance frequency, which frequency may differ from the inherent resonance frequency of the mechanical resonator. According to some embodiments, the phase shifter may be configured to induce a suitable phase shift in the output signal(s) of the mechanical resonator and then provide the phase-shifted signal(s) back to the mechanical resonator as an input signal.

According to another embodiment, an electromechanical device comprises a mechanical resonator, a drive circuit, and an LC tuning subcircuit. The LC tuning subcircuit may be coupled between the mechanical resonator and the drive circuit in some embodiments, although other configurations are also possible. The LC tuning subcircuit may include either a variable inductor or a variable capacitor, or in some embodiments may include both a variable inductor and a variable capacitor. By suitably adjusting the relative reactances of the inductor and capacitor of the LC tuning subcircuit, the resonance frequency of the device may be adjusted to a desired value, regardless of whether that value differs from the inherent resonance frequency of the mechanical resonator.

According to one aspect of the present invention, a frequency-tunable oscillator circuit is provided including a resonator. In some embodiments, the oscillator circuit includes a phase shifter introducing a fixed phase shift and amplitude weighting circuitry providing a variable amplitude weighting. Varying the amplitude weighting provided may allow for introducing a variable phase shift in the oscillator circuit, and thus allow for tuning the frequency of the oscillator circuit. The oscillator circuit may operate on single-ended signals, differential signals, or any other suitable signals.

The aspects of the technology described above, as well as additional aspects, will now be described in greater detail. It should be appreciated that these aspects can be used alone, all together, or in any combination of two or more, and thus are not limited in this respect. Also, various embodiments will be described as including devices having mechanical resonators. It should be appreciated that such embodiments apply to any suitable types of devices, including, but not limited to, oscillators, filters, and sensors.

Figure 2:
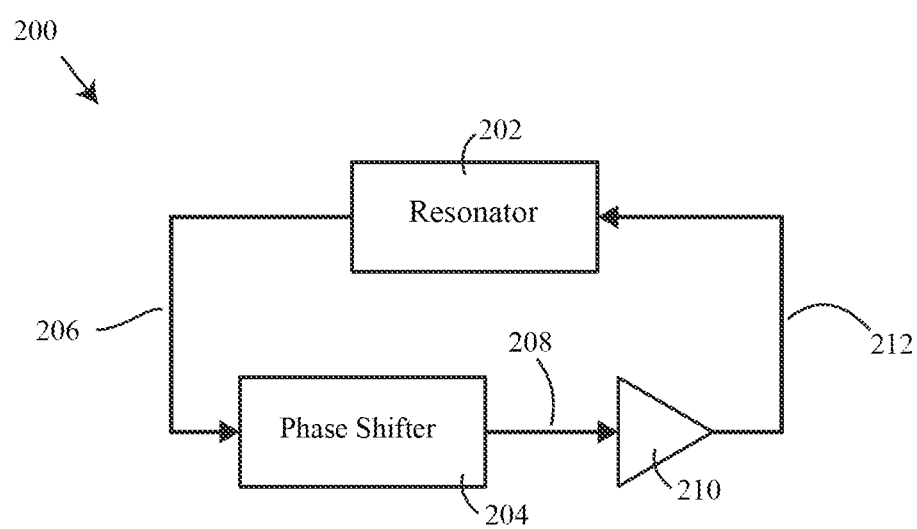
FIG. 2 illustrates a feedback loop comprising a mechanical resonator and a phase shifter according to one embodiment of the technology.

As mentioned, according to one aspect of the technology described herein, a device comprising a mechanical resonator is configured to enable tuning of the device's operating frequency on either side of the series resonance frequency of the mechanical resonator (i.e., above and below the series resonance frequency). FIG. 2 illustrates one non-limiting example of such a device (which, in some embodiments, may be an oscillator), according to one embodiment. The device 200 comprises a mechanical resonator 202 and a phase shifter 204, configured in a feedback loop.

The mechanical resonator 202 may be any type of mechanical resonator, such as a microelectomechanical system (MEMS), a nanoelectromechanical system (NEMS), a bulk acoustic wave (BAW) resonator, a surface acoustic wave (SAW) resonator, a film bulk acoustic resonator (FBAR), or any other suitable resonator, as the various aspects described herein are not limited in this respect. Suitable resonators have been described, for example, in PCT Patent Publication No. WO 2006/083482, and in U.S. patent application Ser. No. 12/142,254, filed Jun. 19, 2008 and published as U.S. Pat. Pub. No. 2009/0243747 on Oct. 1, 2009, all of which are incorporated herein by reference in their entireties.

In some embodiments, the mechanical resonator and/or the device including the mechanical resonator may be formed of two or more materials, for example using two or more material layers. Thus, the operation and resonance frequency of the mechanical resonator and/or device in these embodiments may vary due to material-dependent stresses, for example those stresses arising due to the use of materials having different expansion coefficients. However, not all embodiments are limited in this respect. Moreover, the mechanical resonator may be actuated and/or detected in any suitable manner, including, but not limited to, being actuated and/or detected by piezoelectric techniques, electrostatic techniques, magnetic techniques, thermal techniques, piezoresistive techniques, any combination of those techniques listed, or in any other suitable manner.

Similarly, the phase shifter 204 may be any suitable type of phase shifter for receiving an input signal and producing an output signal having a phase shifted relative to that of the input signal. It should be appreciated that phase shifter 204 may be a variable phase shifter according to some embodiments, such that the amount of phase shift provided by the phase shifter 204 may be varied.

With respect to FIG. 2, the mechanical resonator 202 may produce an output signal 206, having a phase, which output signal may be input to the phase shifter 204. The phase shifter 204, upon receiving the output signal 206 of the mechanical resonator 202, may shift the phase of the output signal 206 and produce a phase-shifted output signal 208. The phase-shifted output signal 208 may be identical to the resonator output signal 206, except for having a different phase. However, the various aspects described herein are not limited in this respect.

According to some embodiments, a gain factor is applied in the feedback loop of device 200. In the non-limiting example of FIG. 2, an amplifier 210 is included to provide gain, and may have any suitable gain factor. The amplifier 210 receives the phase-shifted output signal 208, and produces an amplified output signal 212, which is then provided to an input of the mechanical resonator 202. Thus, in some embodiments, the signal provided to the input of the mechanical resonator 202 may differ from the output of the mechanical resonator in both phase and magnitude, although not all embodiments are limited in this respect.

It should be appreciated that the inclusion and configuration of amplifier 210 for providing gain is subject to variation, and may not be included in all embodiments. For example, a gain stage could alternatively be provided in front of the phase shifter 204 (as opposed to behind the phase shifter 204), to operate directly on the output signal of the mechanical resonator 202. Alternatively, a gain stage may be implemented as part of the phase shifter 204, rather than as a distinct element. Other configurations are also possible, and the various aspects described herein are not limited to using any particular type or configuration of gain element.

In operation, if the total amount of phase shift provided by the phase shifter 204 is greater than, for example, 180 degrees, the device 200 may exhibit resonance at a frequency greater than the series resonance frequency of the mechanical resonator 202. If the total amount of phase shift provided by the phase shifter 204 is less than, for example, 180 degrees, the device 200 may exhibit resonance at a frequency lower than the series resonance frequency of the mechanical resonator 202. Thus, by varying the amount of phase shift provided by the phase shifter 204, the device 200 may be tuned on both sides of the series resonance peak of the mechanical resonator 202, as illustrated in FIG. 3.

Figure 3:
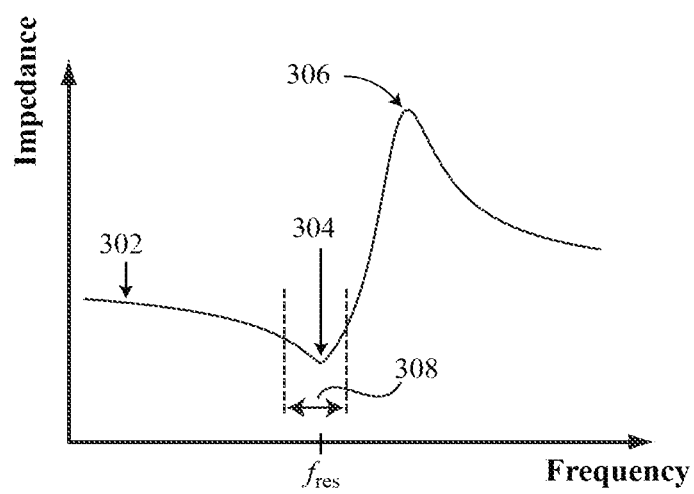
FIG. 3 shows an impedance curve for a resonator, and illustrates that tuning methods according to aspects of the technology described herein allow for tuning on both sides of the series resonance peak.

FIG. 3 is similar to FIG. 1, and illustrates an impedance curve 302 for a resonator. The impedance curve 302 includes a series resonance peak 304, occurring at a resonance frequency of the resonator, labeled as $f_{res}$, as well as a parallel resonance peak 306. The circuit and operation described above in connection with FIG. 2 allow for tuning of a device resonance frequency on both sides of the series resonance peak 304 (i.e., at frequencies greater than or less than the series resonance frequency), as illustrated by the tuning range 308. Thus, flexibility and accuracy in the tuning of a device, such as device 200, may be increased compared to conventional oscillators having mechanical resonators.

It should be appreciated that the amount of phase shift provided by phase shifter 204 may be varied, for example in those embodiments in which phase shifter 204 is a variable phase shifter. The amount of phase shift may be varied to compensate for variations in the inherent resonance frequency of the mechanical resonator 202 during operation, for example including temperature-induced variations, material-stress dependent variations, ambient pressure variations, packaging-induced stress variations, or any other types of variations. For example, a calibration routine may be performed to calibrate the amount of phase shift which phase shifter 204 should provide to compensate for a given change in temperature. Similarly, a calibration routine may be performed to calibrate the amount of phase shift provided by phase shifter 204 to the resulting change in resonance frequency of the device 200. However, it should be appreciated that other methods for determining the amount of phase shift provided by phase shifter 204 may also be used, as the various aspects described herein are not limited in this respect.

It should be appreciated that various modifications and alterations of the device 200 in FIG. 2 may be made while still providing the ability to tune the device 200 on both sides of the series resonance peak of the mechanical resonator 202. For example, according to one embodiment, the phase shifter 204 may perform a coarse phase adjustment and a fine phase adjustment of the resonator output signal 206, in which the coarse phase adjustment is larger than the fine phase adjustment. For example, in some embodiments, the amount of phase shift induced by the coarse phase adjustment may be 50 degrees or more, 90 degrees or more, 120 degrees or more, approximately 180 degrees, between approximately 90-270 degrees, between approximately 120-360 degrees, or any other suitable amount, as the various aspects described herein as implementing a coarse phase adjustment are not limited to providing any particular amount of coarse phase adjustment. The amount of phase shift induced by the fine phase adjustment may be less than that provided by the coarse phase adjustment, and may be, for example, less than approximately 5 degrees, less than approximately 10 degrees, less than approximately 20 degrees, less than approximately 1 degree, between approximately 1-10 degrees, or may be any other suitable amount, as the various aspects described herein as implementing a fine phase adjustment are not limited to providing any particular amount of fine phase adjustment. The coarse and/or fine phase adjustment may be provided in increments of 1 degree, 5 degrees, 10 degrees, a fraction of a degree, or in any other suitable increments, as the various aspects described herein are not limited in this respect.

Figure 4A:
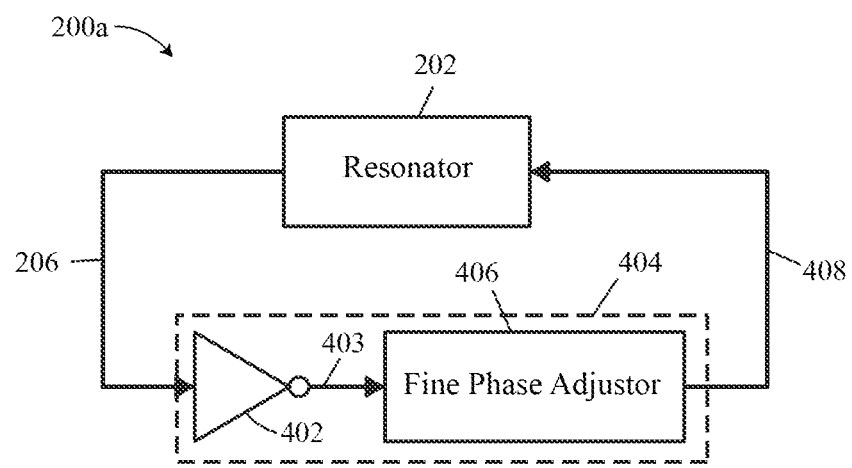
FIGS. 4A-4B illustrate alternative implementations of an electromechanical circuit having a mechanical resonator and a phase shifter, in which the phase shifter includes a coarse phase adjustor and a fine phase adjustor, according to alternative embodiments of the technology.

Device 200a, which is a variation of the device 200, is shown in FIG. 4A, and comprises a phase shifter 404 having an inverting amplifier 402 and a fine phase adjustor 406. The inverting amplifier 402 may function as a coarse phase adjustor, for example receiving the output signal 206 of the mechanical resonator 202 and providing an inverted version 403 of that signal, therefore having a phase shift of approximately 180 degrees from the phase of the output signal 206 of the resonator 202. The output signal 403 of the inverting amplifier 402 may then be provided to the fine phase adjustor 406, which may further adjust the phase by an additional amount, for example by one degree, five degrees, ten degrees, fifteen degrees, a fraction of a degree, or any other suitable amount, to produce the phase-shifted signal 408, which may be provided to an input of the mechanical resonator 202.

It should be appreciated that the device 200a does not include the amplifier 210, since the inverting amplifier 402 may provide gain within the feedback loop. However, not all embodiments are limited in this respect, as any number of gain elements may be included in the feedback loop of a device having a mechanical resonator and a phase shifter.

Figure 4B:
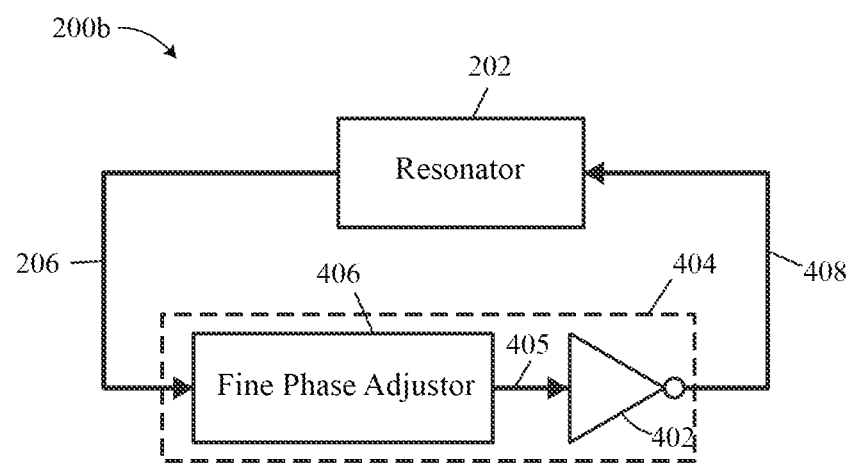

It should further be appreciated that the order in which the coarse phase adjustment and the fine phase adjustment are performed in device 200a is not limiting. For example, FIG. 4A illustrates that the coarse phase adjustment, i.e., the 180 degree phase adjustment provided by inverting amplifier 402, occurs prior to the fine phase adjustment provided by the fine phase adjustor 406. However, as shown in FIG. 4B, the order of the inverting amplifier 402 and the fine phase adjustor 406 may be reversed in a device 200b, such that the fine phase adjustment is performed on the output signal 206 of the resonator 202, with the fine phase-adjusted output signal 405 of the fine phase adjustor being provided to the inverting amplifier 402. The output signal of the inverting amplifier, which may therefore correspond to the phase-shifted signal 408, may then be provided to an input of the mechanical resonator 202.

According to another embodiment, an electromechanical device (e.g., an oscillator, a filter, a sensor, or any other suitable device) comprises a mechanical resonator, an electronic drive circuit, and an LC tuning subcircuit. The LC tuning subcircuit may comprise an inductor and a capacitor, one or both of which may be variable, and may facilitate tuning of the device resonance frequency on both sides of the series resonance frequency of the mechanical resonator.

Figure 5:
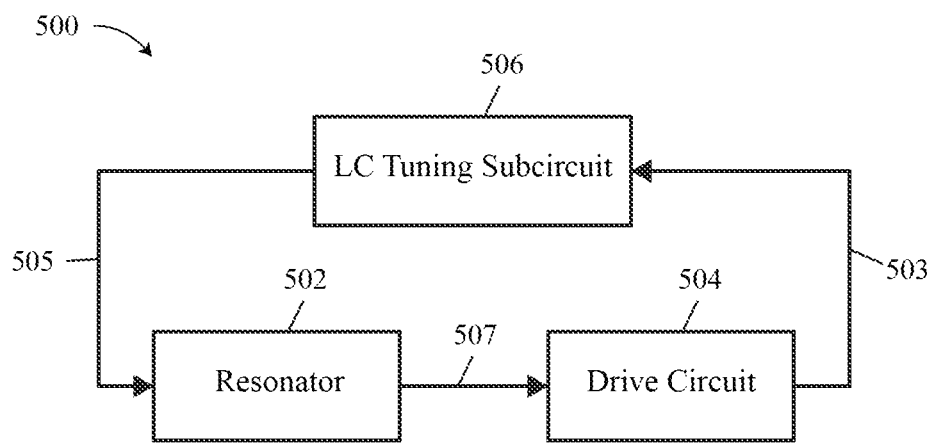
FIG. 5 is a schematic diagram of a device comprising a mechanical resonator, a drive circuit, and an LC tuning subcircuit, according to one embodiment of the technology.

FIG. 5 illustrates one non-limiting example of an electromechanical device 500 comprising a mechanical resonator 502 coupled to a drive circuit 504. The drive circuit 504 provides a drive signal 503 (e.g., an oscillating drive signal (e.g., an AC signal), or any other suitable drive signal) to an LC tuning subcircuit 506, which then provides an output signal 505 to the mechanical resonator 502. The output signal 507 of the mechanical resonator is then provided to an input of the drive circuit 504.

According to some embodiments, the LC tuning subcircuit 506 may be variable, such that the reactance of that subcircuit may be varied to adjust the resonance frequency of the device 500. The LC tuning subcircuit may therefore take any suitable form, one non-limiting example of which is described below in connection with FIG. 6.

The mechanical resonator 502 may be any type of mechanical resonator, such as any of the types mentioned in regard to mechanical resonator 202, above, or any other suitable type of resonator. In some embodiments, micromechanical resonators may be preferred. For example, micromechanical resonators may have a large dimension (e.g., the largest of length, width, thickness, or other dimension depending on the geometry of the mechanical resonator) of less than 100 microns, or may have any other suitable dimension(s). The drive circuit 504 may be any suitable drive circuit for driving the resonator 502, for example at or near the series resonance frequency of the mechanical resonator 502.

Figure 6:
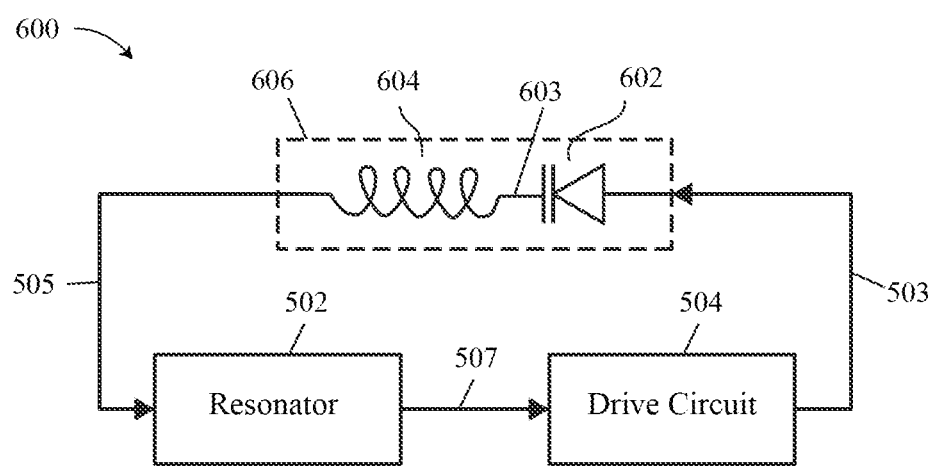
FIG. 6 illustrates one example of an implementation of the device of FIG. 5, in which the LC tuning subcircuit includes a variable capacitor.

FIG. 6 illustrates one non-limiting implementation of a device having a mechanical resonator and an LC tuning subcircuit (such as device 500 of FIG. 5), in which the LC tuning subcircuit includes a variable capacitor and a fixed value inductor. As shown, the device 600 comprises the drive circuit 504, an LC tuning subcircuit 606, and the mechanical resonator 502. In this non-limiting embodiment, the LC tuning subcircuit 606 comprises a variable capacitor 602, which receives the drive signal 503 from the drive circuit 504 and produces an output signal 603. The LC tuning subcircuit further comprises an inductor 604, which in the non-limiting example of FIG. 6 is a fixed value inductor. The inductor 604 receives the output signal 603 from the variable capacitor 602 and produces the output signal 505, which is provided to the mechanical resonator.

In some embodiments of electromechanical devices employing an LC tuning subcircuit (e.g., LC tuning subcircuit 606), any inductors and/or capacitors of the LC tuning subcircuit are distinct from any parasitic inductance and parasitic capacitance of the mechanical resonator of the electromechanical device. In some embodiments, any inductors and/or capacitors of the LC tuning subcircuit have larger values than any parasitic inductances and/or capacitances of the mechanical resonator. For example, in some embodiments, the inductance of an inductor of an LC tuning subcircuit is approximately twice as great as any parasitic inductance of the mechanical resonator, is approximately 1.5-3 times as great, is approximately five times or more (e.g., ten times, 15 times, or any other suitable amount) greater than any parasitic inductance of the mechanical resonator, or has any other suitable value. Similarly, in some embodiments, the capacitance of a capacitor of an LC tuning subcircuit is approximately twice as great as any parasitic capacitance of the mechanical resonator, is approximately 1.5-3 times as great, is approximately five times or more (e.g., ten times, 15 times, or any other suitable amount) greater than any parasitic capacitance of the mechanical resonator, or has any other suitable value.

In operation, the capacitance of the variable capacitor 602 may be varied to adjust a total impedance value of the device 600, for example to minimize the total impedance of the device 600 to achieve resonant behavior. The variable capacitor 602 may be any suitable type of variable capacitor, and therefore its capacitance value may be varied in any suitable manner.

The variable capacitor 602 and the inductor 604 may have any suitable values. For example, according to one non-limiting embodiment, the inductance value of the inductor 604 may be selected such that the reactance of the inductor 604 at a particular frequency is midway between the lower and upper reactances of the variable capacitor at that frequency. As an example, the variable capacitor may have a capacitance which may be varied between 10 and 20 picoFarads, as just one non-limiting example, such that the reactance of the variable capacitor may be varied between an upper reactance value (i.e., when the capacitance is 10 picoFarad) and a lower reactance value (i.e., when the capacitance has a value of 20 picoFarads). The inductance value of inductor 604 may be chosen, for example by suitable design, so that the reactance of the inductor is approximately equal to the midpoint between the lower and upper reactance values of the variable capacitor. It should be appreciated that the actual values of the inductor and capacitor may be chosen appropriately for a desired application, and that the examples given above (e.g., 10 picoFarads for the capacitor) are merely non-limiting examples for purposes of illustration.

The variable capacitor 602 and the inductor 604 may take any suitable form. For example, they may be implemented as discrete electrical components, may be integrated with other components of the device (e.g., as transmission lines, or otherwise), or may be formed in any other suitable manner, as the various aspects described herein are not limited in this respect.

It should further be appreciated that various alterations on the devices 500 and 600 are possible. For example, according to one embodiment, a device comprises an LC tuning subcircuit (e.g., LC tuning subcircuit 506) having a variable inductor and a fixed value capacitor. Alternatively, according to another embodiment, a device comprises an LC tuning subcircuit (e.g., LC tuning subcircuit 506) having both a variable inductor and a variable capacitor.

In any of the scenarios discussed, suitable adjustment of the relative values of an inductor and capacitor of an LC tuning subcircuit may allow for tuning of the device comprising the LC tuning subcircuit on both sides of the series resonance frequency of the mechanical resonator of the device, as shown and described previously in connection with FIG. 3.

Figure 7A:
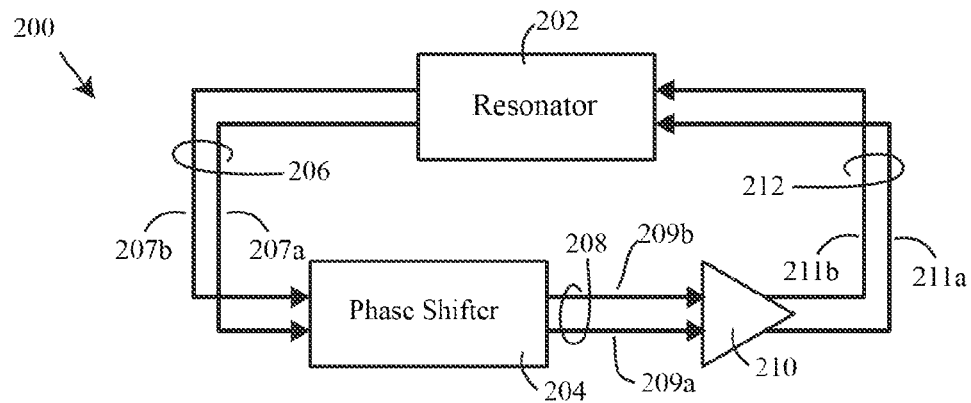
FIGS. 7A-7C illustrate examples of circuits including a mechanical resonator in a feedback loop and configured to operate in connection with multi-ended signals, according to various non-limiting embodiments.

It should be appreciated from the foregoing that the various techniques and circuits described herein may be applied to and work with various types of signals. For example, the signals may be single-ended signals, differential signals, three-phase signals, or any other suitable types of signals. Also, the techniques may apply with various excitation schemes of the mechanical resonator, including, but not limited to, (a) differential-to-differential; (b) single-ended-to-single-ended; (c) single-ended-to-differential; or (d) differential-to-single-ended. FIG. 7A illustrates a non-limiting example.

As shown in FIG. 7A, the device 200 of FIG. 2 may operate on differential signals (i.e., signals having equal amplitude but being 180 degrees out-of-phase with each other) or modified differential signals (i.e., signals having two ends, which may not be equal in amplitude and/or 180 degrees out-of-phase). The mechanical resonator 202 may be a differential mechanical resonator. Thus, the output signal 206 of the mechanical resonator may include two ends, 207a and 207b, where the "ends" of the output signal 206 are the two distinct signals making up the output signal. The output signal 206 may be a differential signal, with the two ends 207a and 207b being equal in amplitude and 180 degrees out-of-phase with each other. However, the embodiment of FIG. 7A is not limited in this respect. Similarly, the phase-shifted output signal 208 may include two ends, 209a and 209b. The end 209a may correspond to the end 207a of output signal 206. Likewise, the end 209b may correspond to the end 207b of output signal 206. In the non-limiting configuration of FIG. 7A, both ends of the phase-shifted output signal 208 may be shifted by the same amount relative to the respective ends of the output signal 206. The amplifier 210 may receive the two ends, 209a and 209b, of phase-shifted output signal 208, and produce the amplified output signal 212. The amplified output signal 212 may include two ends, 211a and 211b, corresponding to ends 209a and 209b, respectively, and being amplified by the same gain factor.

Again, it should be appreciated that the other techniques and circuits described in this application (e.g., other than the device 200) may also implement signals having multiple (two or more) ends, and that the various aspects of the technology are not limited in this respect.

According to one aspect of the technology, a mechanical resonator provides an output signal having multiple ends (e.g., a differential output signal), the phases of which are then shifted by equal amounts. For example, as described, circuit 200 is a non-limiting embodiment conforming to this aspect. In that example, the phase shifter 204 may operate to shift the ends 207a and 207b by the same amount to produce phase-shifted output signal 208.

Figure 7B:
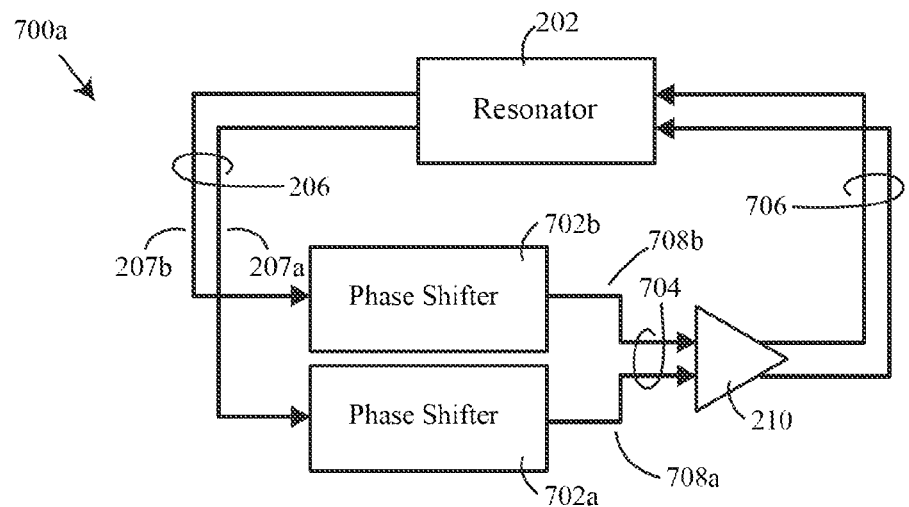
Figure 7C:
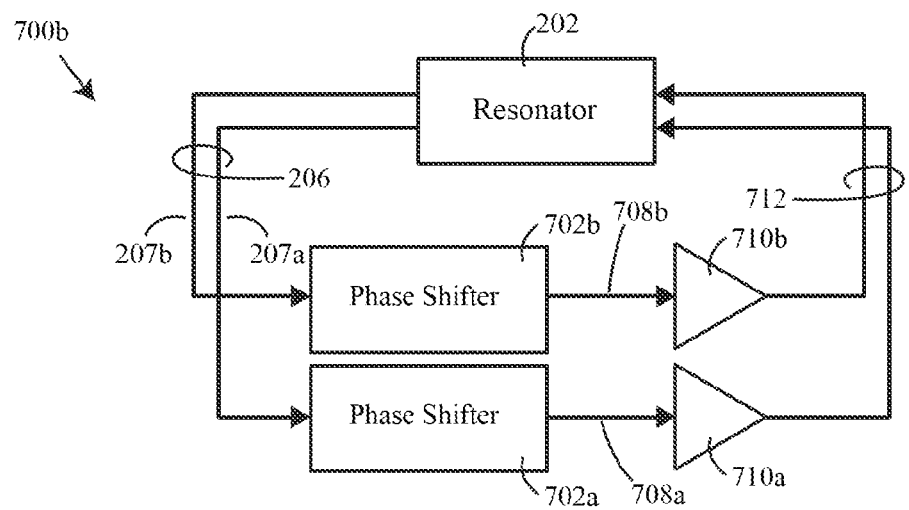

According to another aspect of the technology, a mechanical resonator provides an output signal having multiple ends, the phases of two or more of which are then shifted by differing amounts. FIGS. 7B and 7C illustrate non-limiting examples of circuits which may operate in this manner, and thus provide alternatives to the configuration of FIG. 7A.

In FIG. 7B, the device 700a includes the resonator 202 (which may be a differential resonator) which produces signal 206. One end of the signal 206 is provided to a first phase shifter 702a, while the other end of the signal 206 is provided to phase shifter 702b. Phase shifters 702a and 702b may be of the same type in some embodiments (but are not limited in this respect), and may, in some embodiments, introduce different amounts of phase shift. For example, phase shifter 702a may introduce 90 degrees of phase shift, while phase shifter 702b may introduce 180 degrees of phase shift, as a non-limiting example. The phase shifters may output respective output signals 708a and 708b, representing ends of a combined output signal 704 (e.g., a modified differential signal), which are provided to the amplifier 210. The amplifier 210 may then amplify the ends 708a and 708b by the same amount to produce signal 706, provided as an input to the resonator 202.

The device 700b of FIG. 7C differs from device 700a of FIG. 7B in that, instead of a single amplifier 210, one amplifier is included for each signal path. As shown, signal 708a output by phase shifter 702a is provided to amplifier 710a, while signal 708b output by phase shifter 702b is provided to amplifier 710b. The output signals of amplifiers 710a and 710b form a combined output signal 712 which is input to the resonator 202.

Various modes of operation are possible for the circuit configuration of FIG. 7C. According to a first mode, the phase shifters may be tunable and the amplifiers 710a and 710b may be set to the same gain as each other. In this mode, the configuration of FIG. 7C operates in substantially the same manner as that in FIG. 7B. According to another mode, the phase shifters may be set to different fixed values and the amplifiers 710a and 710b may be set to different values from each other. In still another mode, the phase shifters may be tunable and the amplifiers may also be adjustable. According to a fourth mode, the phase shifters may provide a fixed phase shift (e.g., with the amount of phase shift provided by the two phase shifters being different from each other) and the amplifiers may be adjustable to apply a variable gain, which may then allow for tuning of the amount of phase shift introduced between the resonator output and input.

The above-described techniques of shifting the phases of the ends of a mechanical resonator output signal by differing amounts and then providing an input signal to the mechanical resonator, with the input signal including two or more ends having differing phases, may be performed for any reason. According to some embodiments, such a technique may be used to provide a constant (or approximately constant) input power to the resonator 202. For example, by shifting the phases of the ends of a resonator input signal relative to each other, a constant power of the input signal may be achieved, facilitating efficient operation of the resonator, for example if the input power is maintained approximately constant at a value equal to (or approximately equal to) the maximum input power which the resonator may tolerate.

According to those embodiments in which a resonator output signal has multiple ends and two or more of those ends have their phases shifted by different amounts, the difference in amount of phase shift may take any suitable value(s), and may be static or variable. For example, referring to FIG. 7B, the phase of end 207a of signal 206 may be shifted by a first amount to produce end 708a and the phase of end 207b may be shifted by a second amount to produce end 708b. In some embodiments, the first amount and second amount may differ from each other by between approximately 0 and 20 degrees. In some embodiments, the first amount and second amount may differ from each by between approximately 0 and 10 degrees (e.g., 1 degree, 2 degrees, 5 degrees, etc.). In some embodiments, the first amount and second amount may differ from each other by between 10 and 20 degrees (e.g., 15 degrees). Other ranges and other values for the difference in phase shift may be employed, as the aspects described herein relating to shifting the ends of a resonator output signal by differing amounts are not limited to using any particular differing amount. Also, it should be appreciated that phase shifting the ends of a signal by differing amounts may be accomplished by shifting one of the ends and not shifting another (i.e., phase shifting one end by a non-zero amount and introducing no phase-shift in the other). In addition, as mentioned, the amount of difference may be changed over time.

In addition, it should be appreciated that the above-described techniques for shifting the ends of a resonator output signal by differing amounts may apply to any number of ends of a resonator output signal. For example, if the resonator outputs a 3-phase signal, two or more of the ends may have their phases shifted by different amounts, and then provided to the resonator as an input signal. Thus, the techniques described are not limited to use with any particular types of signals (e.g., single-ended signals, differential signals, modified differential signals, 3-phase signals, etc.).

In addition to shifting the phase(s) of signals of the mechanical resonator, the amplitude(s) may be shifted. For example, according to one embodiment, two ends of a differential output signal of a mechanical resonator may be phase shifted relative to each other (i.e., so there is a phase difference between the two ends) and the amplitudes of the two ends may be different (e.g., by applying different gains to the ends). FIG. 7C illustrates a non-limiting example of a device which may be operated in this manner. The two ends may then be fed back to the mechanical resonator as input signals. The difference in amplitudes of the two ends may further contribute to the resulting phase shift of the input signal to the mechanical resonator comprising the two ends. Thus, the amplitude of the signals may be controlled to further facilitate tuning of the mechanical resonator. Thus, it should be appreciated that a combination of phase-shifting and amplitude adjusting of ends of a signal (e.g., an input signal to the mechanical resonator) may be performed to generate a desired phase difference between the ends. According to one embodiment, an output signal from a mechanical resonator may comprise a first end and a second end, which may then be phase shifted and amplified by different amounts to create a modified signal supplied to the mechanical resonator as an input signal. Other manners of operation are also possible.

Various non-limiting examples of circuits implementing one or more of the techniques described above are now provided for purposes of illustration. It should be appreciated that other circuit designs in accordance with one or more of the aspects described herein are possible, and that variations on those circuits now illustrated are also possible. The following circuits may be implemented as integrated circuits (e.g., as silicon circuitry in silicon substrates) or in other forms, and thus may be used as part of, or in combination with, MEMS devices including mechanical resonators of the types described herein.

Figure 8:
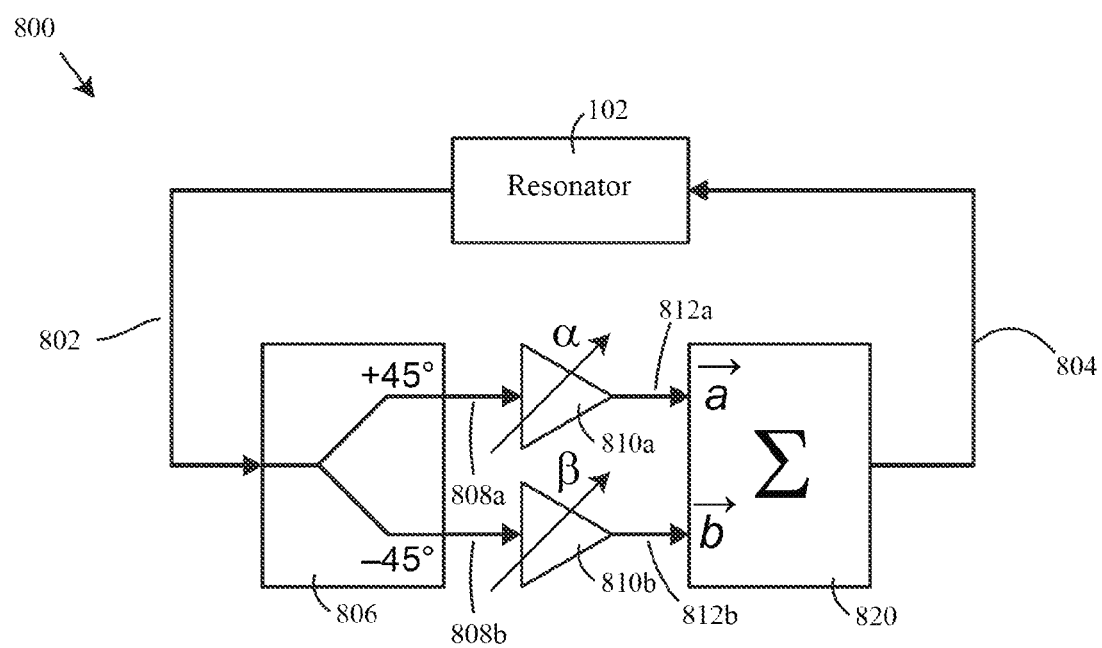
FIG. 8 illustrates a circuit forming a feedback loop including a resonator and phase shifting circuitry, according to one non-limiting embodiment.

FIG. 8 provides a non-limiting example of a circuit including a mechanical resonator configured to operate on single-ended signals and in which a phase shift is induced between an output of the mechanical resonator and an input of the mechanical resonator. As shown, the circuit 800 includes the previously-described resonator 102, which is configured to produce an output signal 802 and receive an input signal 804. The circuit is designed to induce a phase shift between the output signal 802 and the input signal 804, for example to adjust an operating frequency of the resonator 102, thus providing tuning functionality.

In this non-limiting embodiment, the phase shifter 806 receives the output signal 802 and creates two signals 808a and 808b, thus effectively acting as a splitter. The signal 808a has a phase of +45° relative to the signal 802, while the signal 808b has a phase of −45° relative to signal 802, although other phase differences between 808a and 802 and between 808b and 802 are also possible, as will be described further below. Thus, in this non-limiting example, the signals 808a and 808b are out of phase by 90°. In this embodiment, the phase shift introduced by phase shifter 806 may be a fixed phase shift, which may simplify design of the phase shifter.

The phase shifter 806 is coupled to two amplifiers (in this case variable gain amplifiers) 810a and 810b, such that signal 808a is output from the phase shifter 806 to the variable gain amplifier 810a and signal 808b is output from the phase shifter 806 to variable gain amplifier 810b. The signal 808a is amplified or attenuated by a factor α by amplifier 810a to produce a signal 812a, and the signal 808b is amplified or attenuated by a factor β by amplifier 810b to produce a signal 812b. Signals 812a and 812b are then provided from the amplifiers to a summation circuit 820, which sums the signals to produce input signal 804. Summation circuit 820 is coupled to the resonator 102, thus completing a feedback loop.

The amount by which output signal 802 is phase-shifted to produce input signal 804 depends on the phases of signals 808a and 808b and the gains α and β. In particular, it should be appreciated that signals 812a and 812b each has an amplitude and phase, and each may be represented by a vector. Thus, the operation of summation circuit 820 may be understood as effectively adding vectors together. The resulting vector (i.e., the phase and magnitude of a vector representation of signal 804) depends on how the phases of signals 812a and 812b compare to each other and how the amplitudes of signals 812a and 812b compare to each other, as known from principles of vector addition. Thus, a desired phase and amplitude of signal 804 may be achieved by suitable selection of the phases of signals 808a and 808b and the gains α and β. Because, in this non-limiting embodiment, amplifiers 810a and 810b are variable, the values of α and β may be varied to produce a desired phase and amplitude for signal 804. Also, while phase shifter 806 is illustrated as producing two signals each differing in phase by a fixed amount of 45 degrees from an input signal to the phase shifter, it should be appreciated that other phase shift amounts are also possible and that the amount of phase shift introduced by a phase shifter (e.g., phase shifter 806) may be variable in some embodiments. Furthermore, the two signals produced by the phase shifter need not be shifted by the same amount relative to the input signal(s). For example, in an alternative embodiment (not shown), signal 808a may be shifted by, for example, ten degrees relative to output signal 802, while signal 808b may be shifted by, for example, −25 degrees. Thus, various amounts of phase shift may be employed to produce a desired phase difference between signals 802 and 804.

Figure 9A:
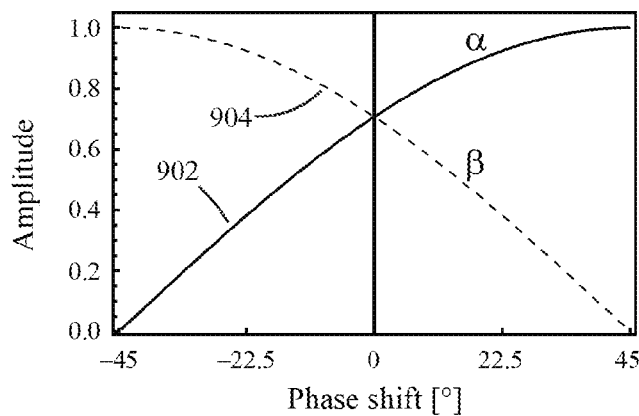
FIGS. 9A-9C illustrate operating characteristics of the circuit of FIG. 8.
Figure 9B:
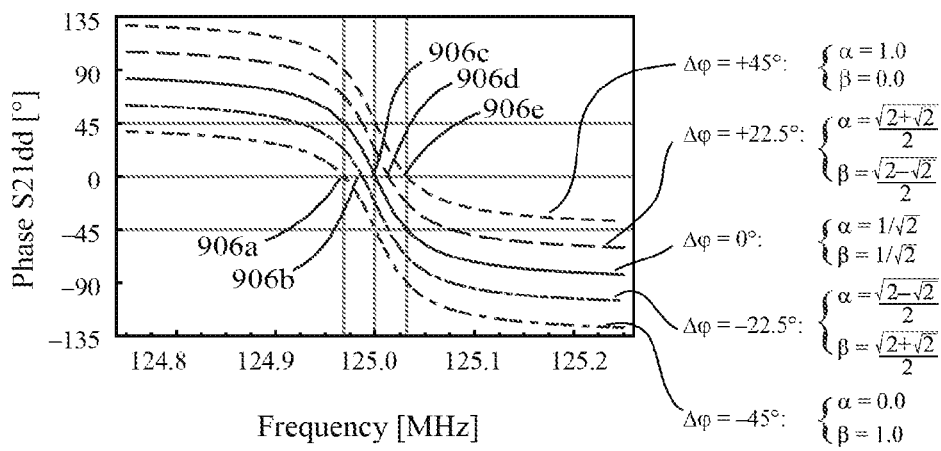
Figure 9C:
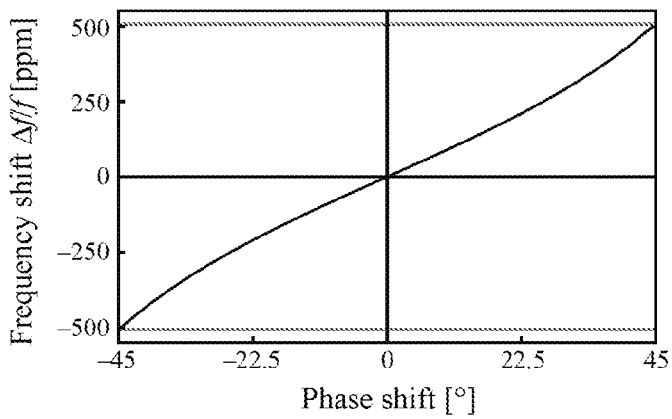

FIGS. 9A-9C illustrate non-limiting examples of the operating characteristics of circuit 800 of FIG. 8. FIG. 9A illustrates the phase difference between 802 and 804 for different values of the gains α (represented by line 902) and β (represented by line 904), assuming that α and β are limited to being within the range of zero to one. It should be appreciated that α and α and β are not so limited in practice, and that other values for each are possible. As illustrated, when α is approximately one and β is approximately zero, the phase difference between signals 802 and 804 is 45 degrees, while when α is approximately zero and β is approximately one, the phase difference is −45 degrees. Thus, suitable selection of the values of α and β allows for choosing a phase difference between 802 and 804 ranging from −45 degrees to 45 degrees, in this non-limiting embodiment. However, in other embodiments the amount of phase shift may be anywhere between +180° and −180° (e.g., between +90° and −90°).

FIG. 9B illustrates the phase of the insertion loss S21dd in degrees as a function of frequency (in MHz) for the circuit 800. The five illustrated lines 906a-906e correspond to different amounts of phase shift Δφ between signals 802 and 804 depending on the values of α and β selected. Resonance for the circuit occurs at the frequency at which the phase of S21dd crosses the zero value (e.g., at 125 MHz for line 906c, a slightly higher frequency for lines 906d and 906e, and a slightly lower frequency for lines 906a and 906b). Thus, by inducing a suitable phase shift Δφ the resonance frequency of the circuit may be tuned.

FIG. 9C illustrates the change in frequency (in parts-per-million) for the circuit 800 as a function of the induced phase shift Δφ (in degrees) between signals 802 and 804. As shown, tuning of +/−500 ppm may be achieved using circuit 800, as a non-limiting example.

Figure 10A:
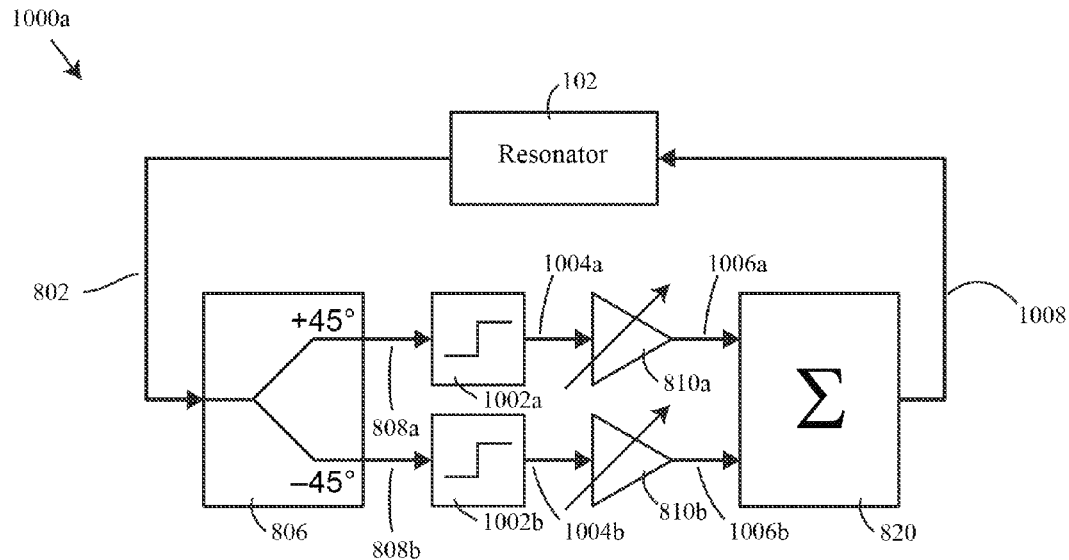
FIGS. 10A and 10B illustrate alternative configurations for circuits forming a feedback loop including a resonator and phase shifting circuitry, according to two more non-limiting embodiments.
Figure 10B:
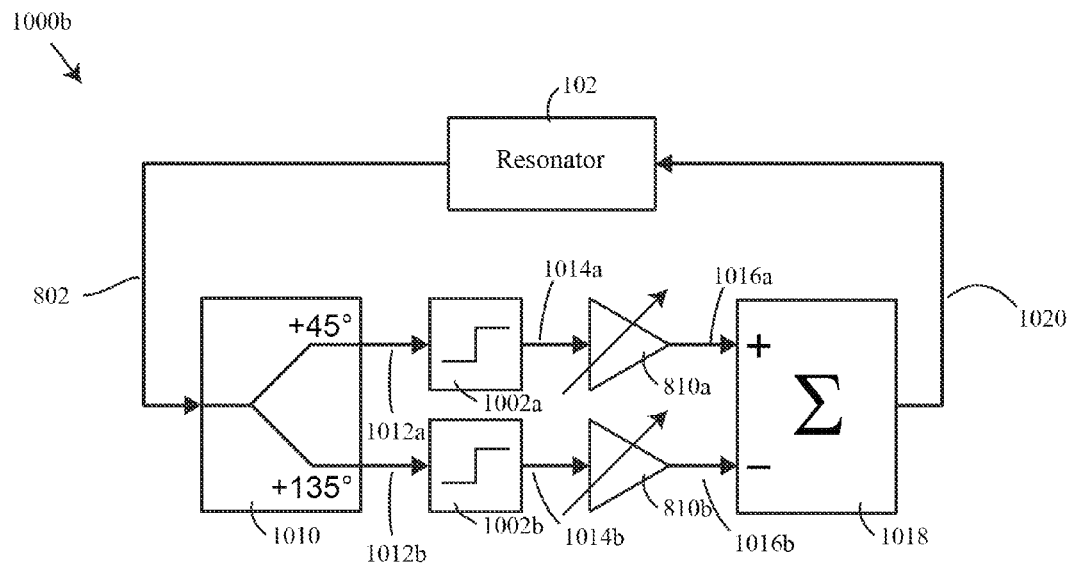

FIGS. 10A and 10B illustrate two non-limiting variations on the circuit 800 of FIG. 8, in which limiters are included to limit an amplitude of the signals. A criterion for steady state oscillation of oscillators including a feedback loop is that the gain for the entire feedback loop be unity. Because many circuit components (e.g., resonators, phase-shifters, summation circuits, etc.) introduce losses into the feedback loop of oscillators including such components, it may be desirable in some situations to provide a large gain to compensate for such losses, at least at startup of the circuit, for example using amplifiers like amplifiers 810a and 810b. However, if the gain of the feedback loop exceeds unity, steady state oscillation may not be achieved, such that it may also be desirable in some situations to provide signal limiting functionality within the oscillator.

Referring first to circuit 1000a of FIG. 10A, the circuit is substantially the same as circuit 800 except for the addition of limiters 1002a and 1002b. Those limiters receive previously-described signals 808a and 808b, respectively, and output limited signals 1004a and 1004b. The amplitude cut-off set by the limiters may be selected to facilitate providing unity gain in the feedback loop, and therefore steady-state oscillation for the circuit 1000a. Thus, any suitable cut-off values may be used. The limiters may be any suitable limiter circuitry, as the various embodiments described herein implementing limiters are not restricted to the type of limiter used. The remaining circuit components operate as previously described, with amplifiers 810a and 810b outputting signals 1006a and 1006b, and summation circuit 820 combining signals 1006a and 1006b to produce signal 1008 which is input to the resonator.

In addition to facilitating steady-state oscillation, the limiters 1002a and 1002b may reduce the noise on signal 1008 compared to that on signal 804. Furthermore, the limiters 1002a and 1002b may prevent amplitude modulated noise injected into the circuit from resulting in undesirable phase modulation.

Circuit 1000b in FIG. 10B shows an alternative to circuit 1000a. The circuit includes a phase shifter 1010 which generates, from the output signal 802 of the resonator, a signal 1012a shifted by +45° relative to signal 802 and signal 1012b shifted by +135° relative to signal 802. Signals 1012a and 1012b are then input to limiters 1002a and 1002b, respectively, which output respective limited signals 1014a and 1014b. Amplifiers 810a and 810b then operate on signals 1014a and 1014b, respectively, to produce signals 1016a and 1016b. By forming the difference of the two signals 1016a and 1016b using summation circuit 1018, instead of adding the signals, the second signal 1016b is virtually added after a 180° rotation. As a result, the input signal 1020 produced by the summation circuit 1018 and input to the resonator 102 is substantially the same as or identical to signal 1008 in the embodiment of FIG. 10A.

Figure 11A:
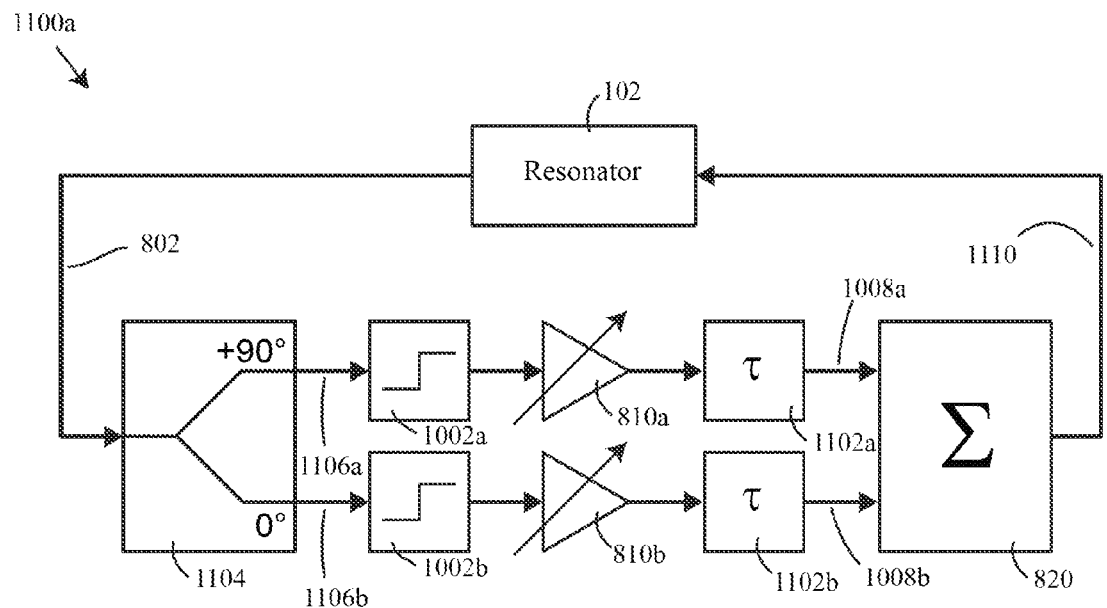
FIGS. 11A and 11B illustrate alternatives to the circuits of FIGS. 10A and 10B, respectively, including lumped delay elements.
Figure 11B:
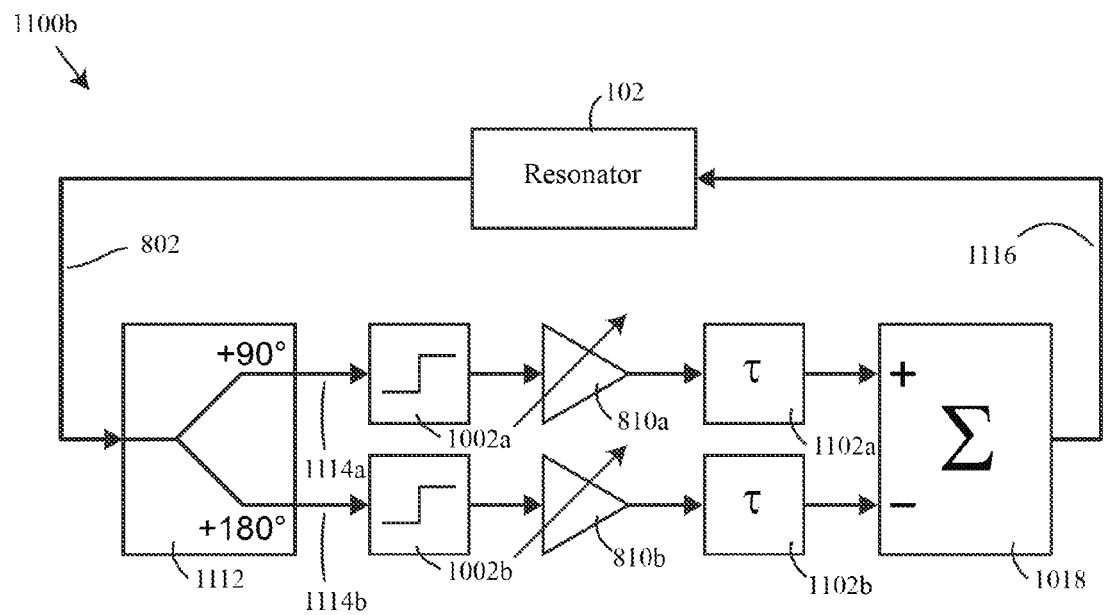

Various components of oscillator circuits may introduce time delays giving rise to phase shifts, which may be accounted for or compensated for using the types of circuits described herein. For instance, amplifiers and shunt capacitors may introduce time delays which result in a negative phase shift of signals in the oscillator circuit. However, as previously mentioned, it may be desirable for the oscillator to operate at the resonance frequency of any resonator of the oscillator, which may require that the total phase shift through the oscillator is an integer multiple of 360° (including zero degrees and negative integers). Thus, the circuits described herein may be designed and/or adjusted during operation to ensure such a condition is met, despite any (undesirable) time delays (and resulting phase shifts) introduced by the circuit components. FIGS. 11A and 11B illustrate two non-limiting examples.

FIG. 11A illustrates an oscillator 1100a which is substantially the same as circuit 1000a of FIG. 10A. However, as shown, time delays (and corresponding phase shifts) introduced by the components of the circuit in FIG. 11A are represented by lumped delay elements 1102a and 1102b, each of which is assumed to produce a negative 45° phase shift) (−45° for purposes of this non-limiting example. It should be appreciated, however, that other amounts of phase shift are also possible, and that −45° is chosen simply for purposes of illustration, and is therefore not limiting. Furthermore, while the undesirable or unintentional phase shift of the components is represented in FIG. 11A as lumped delays in both of the illustrated signal paths, it should be appreciated that the time delays and corresponding phase shift(s) may in actuality be distributed through the circuit and may occur at points within the circuit other than that illustrated (e.g., in the input signal to the resonator, etc.).

The phase shifter 1104 differs from the phase shifter 806 of FIG. 10A in that, to compensate for the phase shift of −45° introduced by each of the delay elements 1102a and 1102b, it generates from the output signal 802 a first signal 1106a shifted 90 degrees relative to the output signal 802 and a second signal 1106b in phase with the output signal 802. In other words, signal 1106a is shifted 45 degrees compared to the corresponding signal 808a in FIG. 10A and signal 1106b is likewise shifted 45 degrees relative to the corresponding signal 808b in FIG. 10A. Limiters 1002a and 1002b and amplifiers 810a and 810b operate as previously described. Thus, the signals 1008a and 1008b output by the delay elements 1102a and 1102b, respectively, are the same in phase as signals 1006a and 1006b of FIG. 10A. As a result, signal 1110 output by the summation circuit 820 in FIG. 11A is substantially the same as signal 1008 in FIG. 10A. Thus, the circuit of FIG. 11A may maintain a suitable phase shift throughout the feedback loop (i.e., an integer multiple of 360 degrees) despite the phase shift introduced by delay elements 1102a and 1102b.

The circuit 1100b of FIG. 11B represents a variation of the circuit 1000b of FIG. 10B, in which undesirable or unintentional time delays and corresponding phase shifts of the components are represented by the lumped delay elements 1102a and 1102*b*. As previously mentioned, the phase shift introduced by each of those delay elements is assumed to be −45 degrees in this non-limiting example, although other values are possible. For the circuit 1100*b* to achieve substantially the same operation as the circuit 1000*b* of FIG. 10B, the phase shifter 1112 produces signals 1114*a* and 1114*b*, which are shifted by 90 degrees and 180 degrees, respectively, relative to the output signal 802. This differs from circuit 1000*b* in that for that example the phase shifter generated signals at 45 degrees and 135 degrees relative to the output signal 802.

The limiters 1002*a* and 1002*b*, amplifiers 810*a* and 810*b*, delay elements 1102*a* and 1102*b*, and summation circuit 1018 operate as previously described. Thus, the signal 1116 input to the resonator 102 is substantially the same as signal 1020 of FIG. 10B, despite the presence of the delay elements 1102*a* and 1102*b*.

From the foregoing examples of FIGS. 11A and 11B, it should be appreciated that any amount of undesirable or unintentional phase shift introduced by the components of the circuit may be suitably compensated, for example by generating signals of suitable phase from the phase shifter of the circuit. In some embodiments, the amount of phase delay introduced by delay elements 1102*a* and 1102*b* may vary during operation, for example as the frequency of operation varies. Thus, in some embodiments, the phase shifter(s) of any such circuit (e.g., phase shifters 1104 and 1112) may be variable, configured to produce phase shifted signals with an adjustable phase, so that the phase may be adjusted to compensate for the varying delays introduced by delay elements 1102*a* and 1102*b*.

Figure 12A:
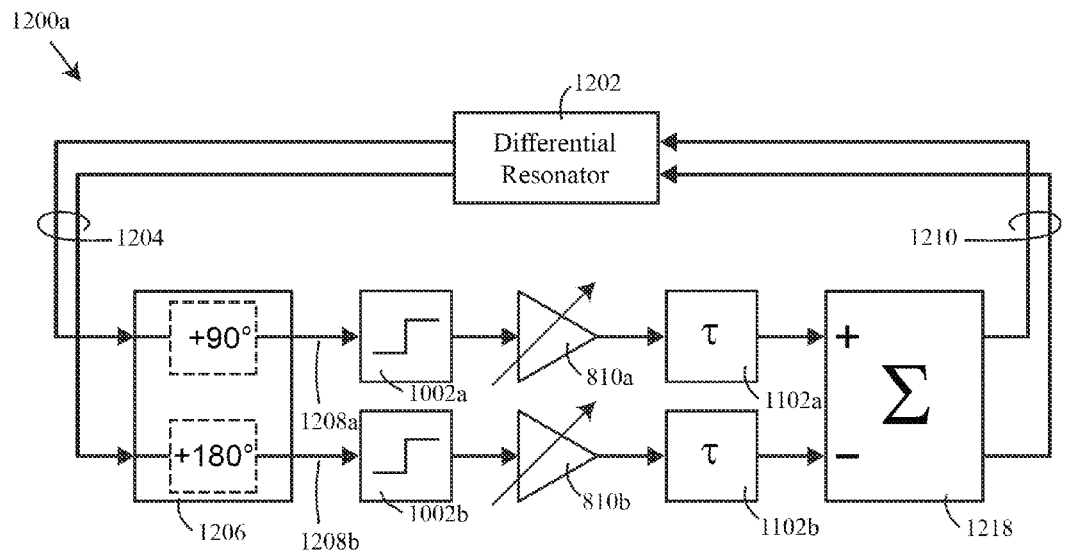
FIGS. 12A and 12B illustrate alternative configurations of differential circuits arranged in a feedback loop including a differential resonator and phase shifting circuitry, according to additional non-limiting embodiments.
Figure 12B:
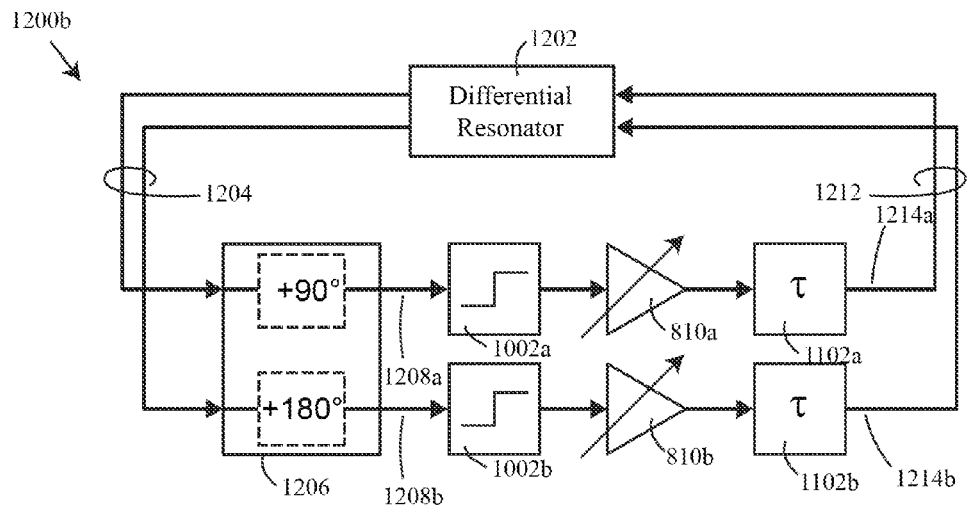

As mentioned previously with respect to FIGS. 7A-7C, one or more of the techniques described herein may be applied to differential resonators or resonators employing any number of signals. FIGS. 12A and 12B illustrate non-limiting examples of such circuits.

The circuit 1200*a* of FIG. 12A includes a differential resonator 1202 which produces a differential output signal 1204 applied to a differential phase shifter 1206. The differential resonator 1202 may be of any suitable type, and may be, for example, of the type described in U.S. patent application Ser. No. 12/639,260, filed Dec. 16, 2009 and entitled "Multi-Port Mechanical Resonating Devices and Related Methods", which is hereby incorporated herein by reference in its entirety. The phase shifter 1206 shifts a first end of the differential output signal 1204 by a first amount (in this non-limiting example, 90 degrees) and the other end of the differential output signal 1204 by a second amount (in this non-limiting example, 180 degrees), thus producing signals 1208*a* and 1208*b*. The limiters 1002*a* and 1002*b*, amplifiers 810*a* and 810*b*, and delay elements 1102*a* and 1102*b* all operate as previously described, in this non-limiting embodiment. As a result, the summation circuit 1218 receives two input signals and produces a signal 1210 provided as an input to the differential resonator 1202. In particular, the summation circuit 1218 may form the difference between the two input signals from delay elements 1102*a* and 1102*b* to produce one end of signal 1210. The second end of signal 1210 may be 180 degrees out-of-phase with the first end of signal 1210. For example, the summation circuit 1218 may produce, from the first end, the second end to be equal in amplitude but 180 degrees out-of-phase with the first end. Other manners of achieving the signal 1210 are also possible. Further, it should be appreciated that such operation of the illustrated summation circuit 1218 may be achieved using various circuit implementations, and thus the summation circuit 1218 is not limited to having any particular circuit implementation.

The circuit 1200*b* of FIG. 12B differs from the circuit 1200*a* in that the summation circuit 1218 is omitted. Thus, the input signal 1212 provided to the differential resonator 1202 includes the two ends 1214*a* and 1214*b* output by the delay elements 1102*a* and 1102*b*, respectively. Presuming the differential resonator 1202 is operated in a differential mode, and that there is minimal or no common mode to differential conversion, the operation of circuit 1200*b* will be substantially the same as that of circuit 1200*a*. This is because the differential resonator 1202, when operated in a differential mode, will naturally form the difference of signals 1214*a* and 1214*b*, as the summation circuit 1218 does in the embodiment of FIG. 12A.

Figure 13:
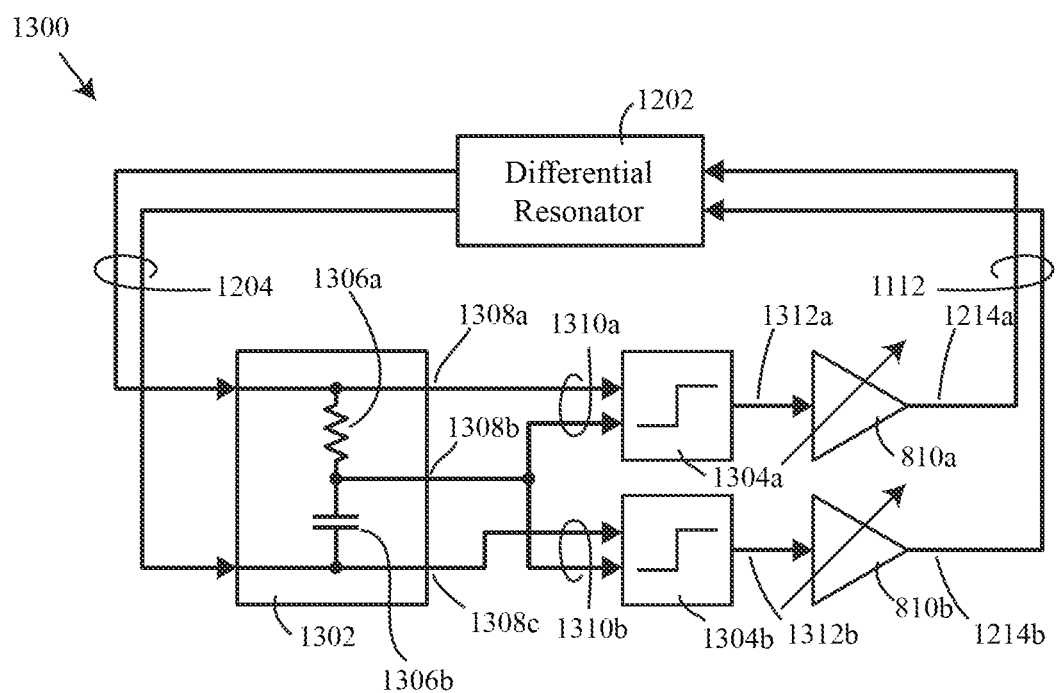
FIG. 13 illustrates an example of the implementation of a circuit of the type illustrated in FIG. 12B.

FIG. 13 illustrates an example of a circuit of the type illustrated in FIG. 12B in further detail. The circuit 1300 includes the differential resonator 1202, a phase shifter 1302, limiters 1304*a* and 1304*b*, and the amplifiers 810*a* and 810*b*. In this non-limiting example, the time delay from delay elements 1102*a* and 1102*b* is assumed to be 0°, such that it may be desirable for the circuit to produce signals shifted by +45° and +135° relative to the differential output signal 1204, as will be described.

The phase shifter 1302 is a 5-port phase shifter including an RC network comprising resistor 1306*a* and capacitor 1306*b*. The differential signal 1204 (which, in this non-limiting example, has a first end with 0° phase shift and a second end with −180° degree phase shift) is received by the phase shifter 1302, which produces three output signals, 1308*a*-1308*c*. The value of the resistor 1306*a* may be chosen to be close to (e.g., within approximately 50% of, within approximately 30% of, within approximately 10% of) or approximately equal to the negative reactance of the capacitor 1306*b*, such that the phase of signal 1308*b* is in between the phase values of signals 1308*a* and 1308*c*, and the output signals 1308*a*-1308*c* have identical amplitudes. As a result, the phase of signal 1308*a* has 0° phase, signal 1308*c* has −180° phase and signal 1308*b* has −90° phase, assuming the resistor value and capacitor value are as described.

The differential limiters 1304*a* and 1304*b* are 3-port devices. Their operation is substantially the same as that of the 2-port limiters previously described, except that a 2-port limiter compares the input-signal to ground or zero volts, whereas a 3-port limiter compares one input signal to the second input signal. The output signal 1312*a* of the differential limiter 1304*a* corresponds to the limited signal of the difference of the signals 1308*a* and 1308*b* (which in combination form signal 1310*a*). This is equivalent to creating a vector with a constant length from the two signals 1308*a* and 1308*b*. As these signals have identical amplitudes in this non-limiting embodiment and are at 0° and −90° phase, the output signal 1312*a* has the phase of signal 1308*a* minus signal 1308*b*, and therefore +45° phase. Similarly, the output of the differential limiter 1304*b* is related to the phase of the difference of the signals 1308*c* and 1308*b* (which in combination form signal 1310*b*), and therefore +135° phase. The output signals 1312*a* and 1312*b* are then respectively weighted by the amplifiers 810*a* and 810*b* and fed back to the differential resonator.

Figure 14A:
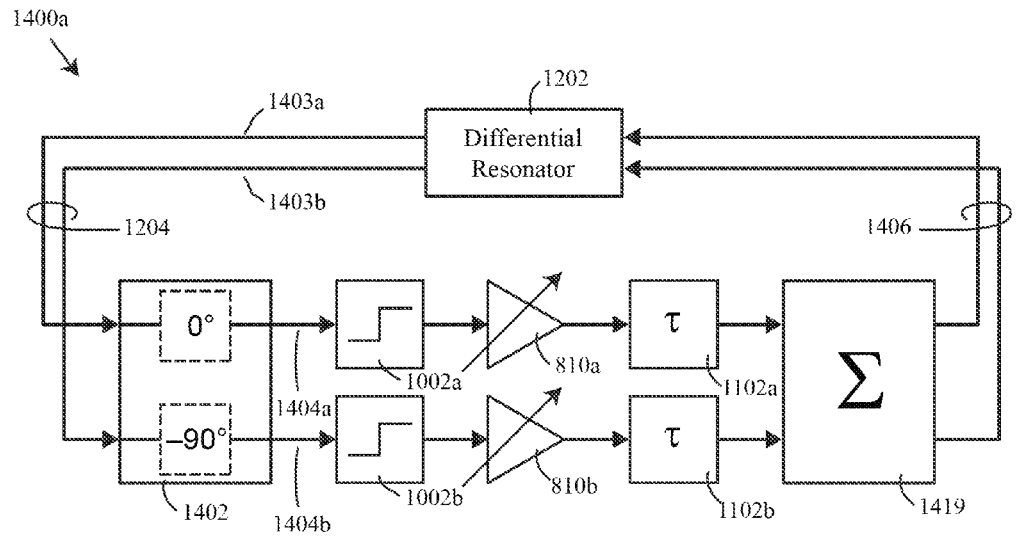
FIG. 14A illustrates an alternative configuration of a differential circuit arranged in a feedback loop including a differential resonator and phase shifting circuitry, according to another embodiment.

FIG. 14A illustrates an alternative to the differential circuit of FIG. 12A. As shown, the circuit 1400*a* includes the differential resonator 1202, a phase shifter 1402, limiters 1002*a* and 1002*b*, amplifiers 810*a* and 810*b*, delay elements 1102*a* and 1102*b*, and a summation circuit 1419. In this non-limiting example, the phase shifter 1402 shifts a first end of the output signal 1204 by zero degrees (i.e., introduces no phase shift) and a second end of the output signal 1204 by −90 degrees, thus producing signals 1404*a* and 1404*b*. The limiters, amplifiers, and delay elements, then operate as previously described. Summation circuit 1419 may operate to sum the signals output by delay elements 1102a and 1102b to form a first end of the signal 1406. The summation circuit 1419 may form, from the first end of signal 1406, a second end of the signal 1406 180 degrees out-of-phase with the first end. Thus, the signal 1406 may be formed by summation circuit 1419 to have two ends 180 degrees out-of-phase with each other. Though, other manners of operation of the summation circuit 1419 are also possible, and any suitable circuit implementation for achieving the described functionality of summation circuit 1419 is possible. Signal 1406 is provided to the differential resonator 1202 as an input signal.

Figure 14B:
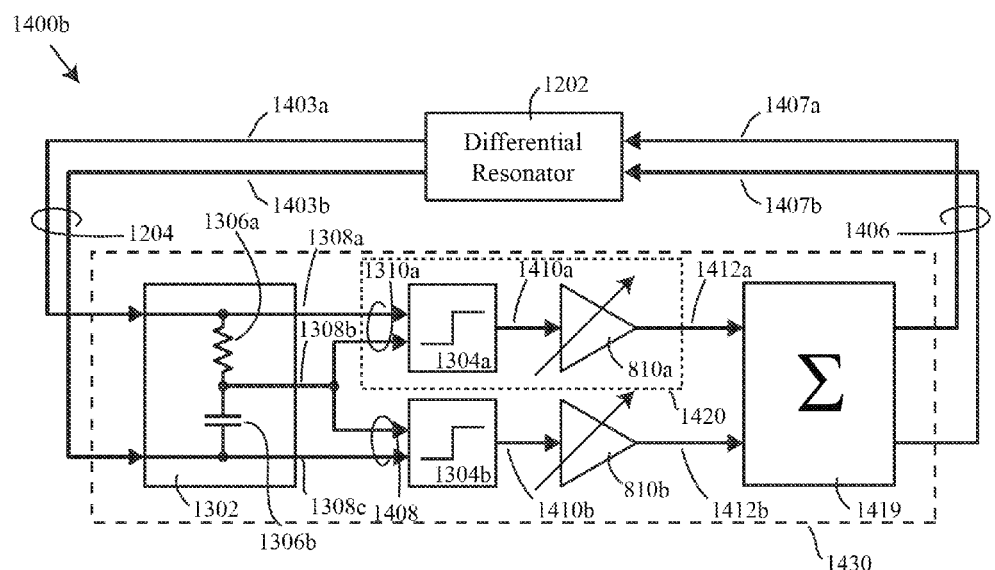
FIG. 14B illustrates an example of the implementation of the circuit of FIG. 14A.

FIG. 14B illustrates a non-limiting example of a detailed implementation of the circuit 1400a. As shown, the circuit 1400b includes the phase shifter 1302, the limiters 1304a and 1304b, the amplifiers 810a and 810b, and the summation circuit 1419. The output signals 1308a, 1308b, and 1308c are as described previously with respect to FIG. 13. Limiter 1304a receives signal 1310a as previously described and outputs a corresponding limited signal 1410a. Limiter 1304b receives input signal 1408 formed of signals 1308b and 1308c and outputs a limited signal 1410b. Input signal 1408 differs from input signal 1310b of FIG. 13 in that the order of the signals 1308b and 1308c is reversed.

The amplifiers 810a and 810b then produce respective signals 1412a and 1412b, which are provided to the summation circuit 1419. The summation circuit combines the signals 1412a and 1412b (e.g., by addition) to produce a first end of signal 1406 and then produces a second end of signal 1406 180 degrees out-of-phase with the first end. Signal 1406 is then input to the differential resonator 1202.

Figure 15:
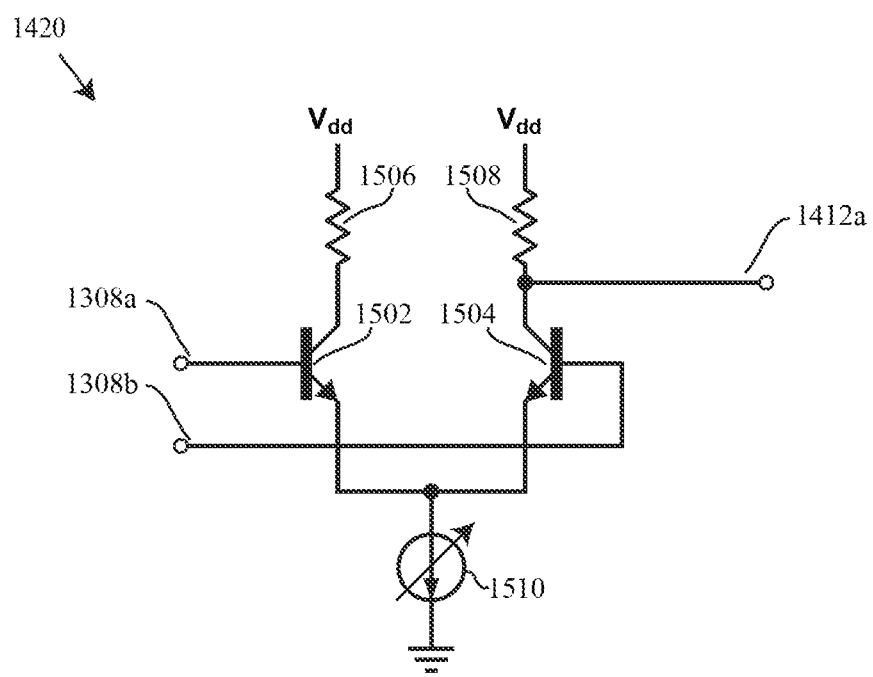
FIG. 15 illustrates an example of the implementation of an amplifier limiter stage of the circuit of FIG. 14B.

FIG. 15 illustrates a non-limiting example of the implementation of the amplifier limiter building block 1420 of FIG. 14B, which corresponds to a differential amplifier with an asymmetric output. As shown, the circuitry includes two transistors 1502 and 1504. While illustrated as bipolar junction transistors, it should be appreciated that other types of transistors (e.g., field effect transistors) may alternatively be used. Resistors 1506 and 1508 are coupled between the transistors 1502 and 1504, respectively, and a power supply, Vdd. A current source 1510 is coupled between the transistors 1502 and 1504 and ground.

The voltage of the signal 1412a is a function of the voltage difference ΔV of the signals 1308a and 1308b. The phase of signal 1412a corresponds to the phase of the voltage difference ΔV. The voltage swing of output 1412a is determined by the product of the current of source 1510 and the resistance value of resistor 1508. The voltage of signal 1412a is a clipped signal, so that if signals 1308a and 1308b form a differential sinusoidal signal the output signal 1412a corresponds to a clipped sine-wave, as a non-limiting example.

It should be appreciated that the circuit configuration illustrated in FIG. 15 is merely a non-limiting example of how the amplifier limiter building block 1420 may be implemented. Other implementations are also possible. For instance, in some embodiments the resistor 1506 may be omitted. While the transistors 1502 and 1504 are shown as npn-type transistors, they are not limited in this respect. For instance, pnp-type bipolar transistors may be used with suitable alteration of the circuit, field-effect transistors (FET) may be used, as well as any other kind of transistor technology or electrical components functioning in a similar fashion, including RF switches and diodes. Other variations are also possible.

Figure 16:
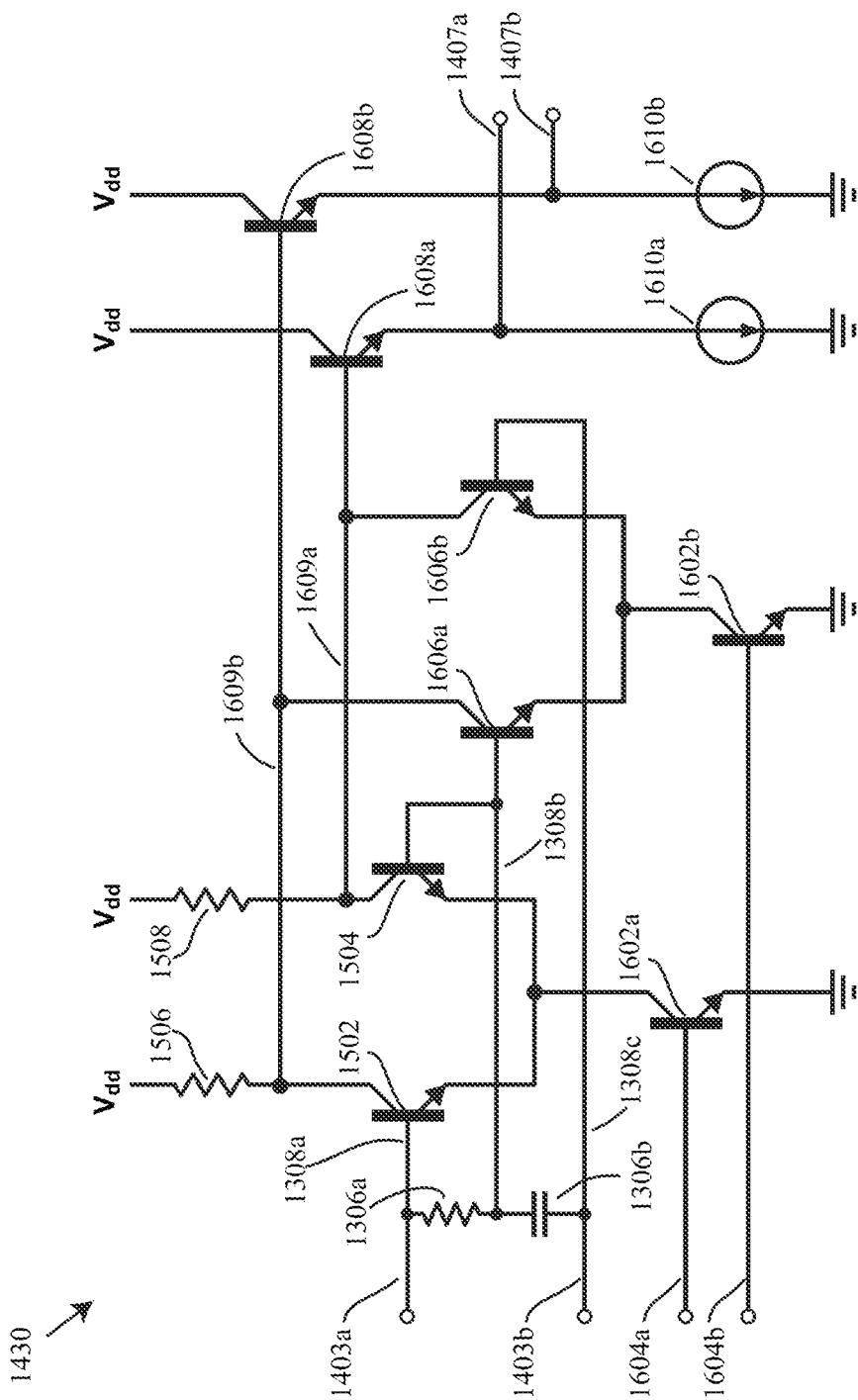
FIG. 16 illustrates an example of the implementation of various components of the circuit of FIG. 14B.

FIG. 16 illustrates a non-limiting example of the implementation of the circuitry within dashed box 1430 of FIG. 14B. As shown, the limiter 1304a and amplifier 810a may be implemented with transistors 1502 and 1504 and resistors 1506 and 1508, as previously described with respect to FIG. 15. The current source 1510 of FIG. 15 may be implemented by transistor 1602a, which is biased by a bias signal 1604a. The limiter 1304b and amplifier 810b may be implemented in a similar form to that shown in FIG. 15. Specifically, referring to FIG. 16, the limiter 1304b and amplifier 810b may be implemented with transistors 1606a and 1606b and resistors 1506 and 1508, together with transistor 1602b operating as a current source and biased by bias signal 1604b.

Signal 1609a represents a clipped signal as it is provided by a limiter. The amplitude of signal 1609a is controlled, in the non-limiting example of FIG. 16, by bias signal 1604a, and the signal has an effective phase of +45°. The second amplifier limiter outputs a signal which is also connected to 1609a in FIG. 16, representing a clipped signal with an amplitude controlled by bias signal 1604b and with an effective phase of −45°. Because both amplifier limiters are connected, in this non-limiting embodiment, to the same output (i.e., the output providing signal 1609a), the signals corresponding to signals 1412a and 1412b in FIG. 14B add and therefore fulfill the functionality represented by summation circuit 1419 in FIG. 14B.

The signal 1609b is also the sum of both amplifier limiter stages, and, because differential stages are being used, corresponds to signal 1609a with a phase shift of −180°. Thus, signals 1609a and 1609b form a differential signal with a phase shift controlled by the amplitude weighting of bias signals 1604a and 1604b. According to one embodiment, the resulting phase shift may be in the range of −45° to +45°.

In this non-limiting example, it may be desirable to buffer signals 1609a and 1609b, for example to provide a lower impedance input to the differential resonator 1202. Thus, as shown in FIG. 16, a buffer stage may be provided for each signal, with each buffer stage being an emitter follower including a transistor (1608a or 1608b) and a corresponding current source (1610a or 1610b). Other buffer configurations are also possible, and buffering is optional.

The input impedance into the RC-network of the phase shifter (e.g., into phase shifter 1302 of FIG. 14B) creates a complex load for the differential resonator 1202. At resonance the resonator electrically acts like a resistor, which is often referred to as motional resistance. The effect of these resistances together with the complex input impedance of the RC-network is that the amplitude of the signals 1308a-1308c decreases for an increasing motional resistance of the resonator in relation to the resistance of resistor 1306a. Also, a phase delay is introduced, with a larger negative phase delay being introduced for a larger motional resistance in relation to the resistance of resistor 1306a. Other parasitics may also add a few degrees of phase delay, mostly negative. As a result, the tuning characteristic of the circuit in FIG. 16 may be shifted compared to that shown in FIG. 9C.

It should be appreciated that some of the phase-shifting techniques described herein may enable variable phase-shifting to be achieved without the need for a variable capacitor, an inductor (of fixed or variable value), tunable diodes (also known as varactors), and/or variable resistors. As some of these components may complicate the design of integrated circuits (ICs), the avoidance of them may be beneficial, for example in those embodiments in which the circuits described herein are implemented as ICs. For instance, forming inductors in integrated circuits can be complicated and can lead to undesirable eddy currents in some configurations, such that it may be beneficial to have an IC phase-shifter that avoids the need for an inductor.

Those phase-shifting techniques described herein utilizing amplitude weighting of different amounts on different signals (e.g., different ends of a differential signal) may avoid any need for variable capacitors, variable resistors, inductors, and/or varactors. A fixed phase shift may be applied using, for example, an RC circuit, a non-limiting example of which is illustrated in FIGS. 13 and 16. A variable phase shift may be achieved using amplitude weighting, as described herein (e.g., the embodiments of FIGS. 7C, 8, 10A, 10B, 11A, 11B, 12A, 12B, and 13 among others), for example by varying a gain applied to one or more signals and applying different gains (variable, in some embodiments) to different signals and then suitably combining the signals as described herein. Thus, tunable oscillators having a variable phase shift may be achieved according to one or more of the aspects described herein without the need for tunable inductors, tunable resistors, tunable capacitors, varactors or tunable diodes. Accordingly, phase-shifted signals may be produced without the use of variable capacitors, variable resistors, inductors, and/or varactors.

As mentioned, one or more of the apparatus and techniques described above may provide accuracy and flexibility in tuning of a device. For example, according to some embodiments, the tuning range of a device (e.g., tuning range 308) may be approximately 700 parts-per-million (ppm) of the resonance frequency of the device and/or the mechanical resonator (which may be, for example, any of the resonance frequencies listed below, or any other suitable resonance frequency), may be at least 300 ppm of the resonance frequency, may be at least 400 ppm of the resonance frequency, may be at least 500 ppm of the resonance frequency, may be up to 1500 ppm of the resonance frequency, may range from 300-800 ppm of the resonance frequency (e.g., between approximately 400 and 600 ppm, between approximately 500 and 700 ppm, between approximately 600-800 ppm), may range from 5-200 ppm (e.g., between approximately 50-100 ppm), or may have other values. Also, as mentioned, the ability to adjust the resonance frequency of a device on both sides of a series resonance frequency of a mechanical resonator may relax design constraints on the mechanical resonator, since any deviation of the inherent resonance frequency of the mechanical resonator from a desired value may be compensated for by suitable tuning. Similarly, temperature-induced variations, package-induced variations, and/or material stress induced variations in the resonance frequency of the mechanical resonator may be compensated for using one or more of the techniques described above.

According to some embodiments, one or more of the circuits and methods described above may be implemented as a MEMS, a NEMS, or any other suitable device. For example, one or more of the components of the devices shown in FIGS. 2, 4A-4B, 5-8 and 10-16 may form part, or all, of a MEMS. However, it should be appreciated that the apparatus and methods described herein are not limited to use with MEMS, NEMS, or any other particular structures. As such, other configurations are also possible.

According to some embodiments, the mechanical resonators and/or devices described herein may be packaged. As a result, in some embodiments, the resonance frequency of the mechanical resonators and/or devices may be subject to package-induced stresses, and the tuning methods described herein may be used to compensate for such stresses.

According to some embodiments, the tuning methods described herein may be used in combination with other tuning methods, including but not limited to stress tuning, either by electrostatic techniques or piezoelectric techniques.

Other types of tuning are also possible, as the various aspects described herein are not limited to being used as the sole type of tuning of a device.

As mentioned, the various aspects described herein including mechanical resonators are not limited to use with any particular type of mechanical resonator. It should be appreciated that the mechanical resonators (e.g., mechanical resonators 202 and 502) may be of any suitable type, as the various aspects of the technology are not limited in this respect. Thus, aspects of the technology may apply to devices having mechanical resonators of various materials/compositions, shapes, sizes, and/or methods of actuation and/or detection.

For example, the mechanical resonator may comprise or be formed of any suitable material(s) and may have any composition. According to some embodiments, the mechanical resonator may comprise or be formed of a piezoelectric material. According to some embodiments, the mechanical resonator comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonator comprises a piezoelectric material, the piezoelectric material may be single crystal material. According to some embodiments, the mechanical resonator may comprise a base on which additional structures (e.g., electrodes) are formed, and the base may comprise any of those materials listed, or any other suitable materials.

According to some embodiments, the mechanical resonator comprises or is formed of multiple layers, making the structure a composite structure. For example, a mechanical resonator may comprise a base on which electrodes are formed, thus making the structure a composite structure. In addition, or alternatively, the base itself may comprise one or more layers of differing materials, shapes, and/or thicknesses. For example, the base of the mechanical resonator may comprise an active layer and one or more insulating layers.

The mechanical resonator may have any shape. For example, aspects of the technology may apply to mechanical resonators that are substantially rectangular, substantially ring-shaped, substantially disc-shaped, or that have any other suitable shape. Moreover, the mechanical resonator may have one or more beveled edges. According to some embodiments, the mechanical resonator may be substantially planar.

The mechanical resonator may have any suitable dimensions. According to some embodiments, the mechanical resonator has a thickness T, which in some embodiments is less than approximately three wavelengths of a resonance frequency of interest of the mechanical resonator. According to some embodiments, the thickness is less than approximately two wavelengths of the resonance frequency of interest. In still other embodiments, the thickness may be less than approximately one wavelength of the resonance frequency of interest (e.g., less than approximately one wavelength of a resonant Lamb wave supported by the mechanical resonator). The thickness may determine or depend on the types of waves supported by the mechanical resonator. For example, a given thickness may limit the ability of the mechanical resonator to support Lamb waves, or certain modes of Lamb waves. Thus, it should be appreciated that the thickness may be chosen in dependence on the types and/or modes of waves desired to be supported by the mechanical resonator. It should also be appreciated that thickness values other than those listed may be suitable for some applications, and that the various aspects described herein are not limited to using mechanical resonators having any particular thickness values.

According to some embodiments, the mechanical resonator may have a large dimension (e.g., the largest of length, width, diameter, circumference, etc.) of less than approximately 1000 microns, less than 100 microns, less than 50 microns, or any other suitable value. It should be appreciated that other sizes are also possible. According to some embodiments, the devices described herein form part or all of a microelectromechanical system (MEMS).

The mechanical resonator may have any desired resonance frequencies and frequencies of operation, and may be configured to provide output signals of any desired frequencies. For example, the resonance frequencies and/or frequencies of operation of the mechanical resonators, and the frequencies of the output signals provided by the mechanical resonators, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the frequencies are not limiting.

The mechanical resonators may be actuated and/or detected in any suitable manner, with the particular type of actuation and/or detection depending on the type of mechanical resonator, the desired operating characteristics, or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

It should be understood that the tuning methods described herein may be applied to devices having various types of mechanical resonators, including using quartz crystal resonators, bulk acoustic wave (BAW) resonators, surface acoustic wave (SAW) resonators, plate acoustic wave (PAW) resonators, (thin) film plate acoustic resonators (FPAR), film bulk acoustic resonators (FBAR), solid mounted resonators (SMR), contour mode resonators (CMR), thin-film piezoelectric on silicon (TPoS), microelectromechanical systems (MEMS) technology, or any other type of resonator technology that uses mechanical vibrations in a solid to excite a resonance frequency. It should be appreciated that as used herein the term "mechanical resonator" encompasses at least quartz crystal resonators, BAW, SAW, PAW, SMR, FPAR, FBAR, CMR, thin-film piezoelectric on silicon (TPoS) resonator technology, and MEMS resonators.

According to some embodiments, the devices described herein may be piezoelectric Lamb wave devices, such as piezoelectric Lamb wave resonators. Such Lamb wave devices may operate based on propagating acoustic waves, with the edges of the mechanical resonator serving as reflectors for the waves. For such devices, the spacing between the resonator edges may define the resonance cavity, and resonance may be achieved when the cavity is an integer multiple of p, where $p=\lambda/2$, with $\lambda$ being the acoustic wavelength of the Lamb wave. However, it should be appreciated that aspects of the technology described herein apply to other types of structures as well, and that Lamb wave structures are merely non-limiting examples.

In some embodiments including mechanical resonators, the mechanical resonators may be suspended, in that they may have one or more segments which are not directly attached to any other structures. It should be appreciated that various forms of "suspended" structures may be used, including, but not limited to, structures having any one or more free surfaces.

In some embodiments, mechanical resonators such as those described herein may include one or more electrodes, for example to actuate the mechanical resonator. In such embodiments, the mechanical resonator may have any suitable type, number, and configuration of electrodes. For example, the electrodes may be formed of any suitable material. Any number of electrodes may be included. For example, in some embodiments, one electrode is connected to each of an input port and an output port to drive and sense the operation of the mechanical resonator. In other embodiments, more than one electrode may be connected to each electrical port. In some embodiments, the electrodes are individual strips. However, the electrodes may take any suitable shape. The electrodes may extend along substantially the entire width W of a mechanical resonator, or may alternatively extend along only a part of the width (e.g., half the width, a quarter of the width, etc.). Other configurations are also possible, as the various structures herein including electrodes are not limited to any particular number, shapes, or configurations of electrodes, unless so stated.

It should be appreciated from the foregoing, that in some embodiments variable tuning functionality (e.g., variable frequency tuning functionality) may be provided with a circuit including phase shifters providing a fixed phase shift. In such instances, the variable tuning may be provided by applying variable gain to phase shifted signals as described. Thus, the design of the phase shifter may be simplified and may be implemented using conventional IC technology. According to other embodiments, fixed amplitude weighting may be provided and one or more variable phase shifters may be included in a tuning circuit. According to still other embodiments, a variable phase shifter and variable gain circuit may be employed to provide variable frequency tuning.

While some of the aspects and embodiments described above have been described as applying to circuits including mechanical resonators, not all aspects and embodiments are limited in this respect. Rather, the phase shifting circuitry and techniques described may be used to tune phased array antennas, or other devices in which phase shifting of signals is desired. Similarly, the techniques may be used for signal processing applications, for phase-shift encoding, for operation of radiation adaptive antennas, and in gyroscopes for phase matching and mode matching control. Thus, it should be appreciated that the applications described herein are provided for purposes of illustration and are not limiting.

One or more of the aspects and embodiments described herein may provide various beneficial operating characteristics for devices. For example, the tuning techniques described herein may allow for oscillators with very low phase noise. One or more of the oscillators described herein may have an unloaded Q factor less than approximately 8,000 and/or a loaded Q factor less than approximately 4,000. Other beneficial operating characteristics may also be realized.

Having described several embodiments of various aspects of the technology in detail, various modifications and improvements will readily occur to those skilled in the art. Such modifications and improvements are intended to be within the spirit and scope of the various aspects of the technology. Accordingly, the foregoing description is by way of example only, and is not intended as limiting. The technology is limited only as defined by the following claims and the equivalents thereto.

What is claimed is:

1. A method of tuning a device having a mechanical resonator, the method comprising:
receiving an output signal of the mechanical resonator operating in a resonance condition;
producing a phase-shifted signal from the output signal, wherein producing the phase-shifted signal comprises generating, from the output signal, a first signal phase-shifted relative to the output signal by a first non-zero amount and a second signal phase-shifted relative to the output signal by a second non-zero amount differing from the first non-zero amount; and
inputting the phase-shifted signal to the mechanical resonator,
wherein the output signal is a first end of a differential signal and wherein the method further comprises generating, from a second end of the differential signal, a third signal phase-shifted relative to the second end by a third non-zero amount and a fourth signal phase-shifted relative to the second end by a fourth non-zero amount.

2. The method of claim 1, wherein producing the phase-shifted signal is performed without using a variable capacitor.

3. The method of claim 1, wherein the first non-zero amount is a positive amount and wherein the second non-zero amount is a negative amount.

4. The method of claim 1, wherein producing the phase-shifted signal comprises generating the first signal and second signal directly from the output signal.

5. A method of tuning a device having a mechanical resonator, the method comprising:
receiving an output signal of the mechanical resonator operating in a resonance condition;
producing a phase-shifted signal from the output signal wherein, producing the phase-shifted signal comprises generating, from the output signal, a first signal to the phase-shifted relative to the output signal by a first non-zero amount and a second signal phase-shifted relative to the output signal by a second non-zero amount differing from the first non-zero amount; and
inputting the phase-shifted signal to the mechanical resonator,
wherein producing the phase-shifted signal further comprises amplitude weighting the first signal and second signal by different amounts,
wherein producing the phase-shifted signal further comprises combining the first signal and second signal subsequent to amplitude weighting the first signal and second signal by different amounts, and
wherein producing the phase-shifted signal further comprises limiting an amplitude of the first signal and/or the second signal.

6. The method of claim 5, wherein combining the first signal and the second signal comprises adding the first signal and the second signal together.

7. The method of claim 5, wherein limiting an amplitude of the first signal and/or the second signal comprises limiting the amplitude by an amount configured to provide a feedback loop comprising the mechanical resonator with unity gain.

8. The method of claim 5, wherein amplitude weighting the first signal and second signal by different amounts comprises applying unity gain to one of the first signal and second signal.

9. The method of claim 5, wherein amplitude weighting the first signal and second signal, limiting an amplitude of the first signal and/or second signal, and combining the first signal and second signal is performed by the same circuit.

10. The method of claim 5, wherein generating the first signal and the second signal comprises splitting the output signal.

11. A method of tuning a device having a mechanical resonator, the method comprising:
receiving an output signal of the mechanical resonator operating in a resonance condition;
producing a phase-shifted signal from the output signal, wherein producing the phase-shifted signal comprises generating, from the output signal, a first signal phase-shifted relative to the output signal by a first non-zero amount and a second signal phase-shifted relative to the output signal by a second non-zero amount differing from the first non-zero amount; and
inputting the phase-shifted signal to the mechanical resonator,
wherein the output signal of the mechanical resonator is a multi-ended signal comprising a first end and a second end and wherein producing the phase-shifted signal comprises phase-shifting the first end relative to the second end,
wherein producing the phase-shifted signal further comprises amplitude weighting the first end and second end by different amounts,
wherein producing the phase-shifted signal further comprises limiting an amplitude of the first end and/or the second end.

12. The method of claim 11, wherein phase-shifting the first end relative to the second end comprises phase-shifting the first end by a first amount and phase shifting the second end by a second amount.

13. The method of claim 11, wherein phase-shifting the first end relative to the second end is performed prior to amplitude weighting the first end and second end by different amounts.

14. The method of claim 11, wherein amplitude weighting the first end and second end by different amounts is performed prior to phase-shifting the first end relative to the second end.

15. A method of tuning a device having a mechanical resonator, the method comprising:
receiving an output signal of the mechanical resonator operating in a resonance condition;
producing a phase-shifted signal from the output signal, wherein producing the phase-shifted signal comprises generating, from the output signal, a first signal phase-shifted relative to the output signal by a first non-zero amount and a second signal phase-shifted relative to the output signal by a second non-zero amount differing from the first non-zero amount; and
inputting the phase-shifted signal to the mechanical resonator,
wherein the output signal of the mechanical resonator is a multi-ended signal comprising a first end and a second end and wherein producing the phase-shifted signal comprises phase-shifting the first end relative to the second end,
wherein producing the phase-shifted signal further comprises adding signals resulting from phase-shifting the first end relative to the second end using a differential summation circuit.

16. A device, comprising:
a mechanical resonator configured to operate in a resonance condition; and a processing circuit coupled to the mechanical resonator and configured to:
  receive an output signal of the mechanical resonator,
  produce a phase-shifted signal shifted in phase relative to the output signal by generating, from the output signal and using a phase shifter, a first signal phase-shifted relative to the output signal by a first non-zero amount and a second signal phase-shifted relative to the output signal by a second non-zero amount differing from the first non-zero amount, and
  provide the phase-shifted signal to an input of the mechanical resonator,
wherein the output signal is a first end of a differential signal and wherein the processing circuit is further configured to generate, from a second end of the differential signal, a third signal phase-shifted relative to the second end by a third non-zero amount and a fourth signal phase-shifted relative to the second end by a fourth non-zero amount.

17. The device of claim 16, wherein the phase-shifted signal has a variable amount of phase shift, and wherein the processing circuit does not include a variable capacitor.

18. The device of claim 16, wherein the processing circuit does not include an inductor.

19. The device of claim 16, wherein the phase shifter is coupled directly to an output of the mechanical resonator providing the output signal.

20. A device, comprising:
a mechanical resonator configured to operate in a resonance condition; and
a processing circuit coupled to the mechanical resonator and configured to:
  receive an output signal of the mechanical resonator,
  produce a phase-shifted signal shifted in phase relative to the output signal by generating, from the output signal and using a phase shifter, a first signal phase-shifted relative to the output signal by a first non-zero amount and a second signal phase-shifted relative to the output signal by a second non-zero amount differing from the first non-zero amount, and
  provide the phase-shifted signal of the mechanical resonator,
wherein the processing circuit further comprises a gain circuit coupled to the phase shifter and configured to modify an amplitude of the first signal by a different amount than an amplitude of the second signal,
wherein the processing circuit further comprises a combination circuit configured to combine the first signal and second signal subsequent to operation of the phase shifter and gain circuit,
wherein the processing circuit further comprises a limiter configured to limit an amplitude of the first signal and/or the second signal.

21. The device of claim 20, wherein the combination circuit is a summation circuit.

22. The device of claim 20, wherein the limiter is configured to limit the amplitude by an amount configured to provide a feedback loop comprising the mechanical resonator with unity gain.

23. The device of claim 20, wherein the gain circuit is configured to apply unity gain to one of the first signal and second signal.

24. The device of claim 20, wherein the gain circuit, the combination circuit, and the limiter are the same circuit.

25. The device of claim 20, wherein the phase shifter is configured to generate, at least in part, the first signal and second signal by splitting the output signal.

26. The device of claim 16, wherein the phase shifter is a variable phase shifter configured to provide a variable amount of phase shift of the output signal of the mechanical resonator.

27. A device, comprising:
a differential mechanical resonator having an output and configured to produce a differential output signal; and
a processing circuit comprising a phase shifter coupled directly to the output of the differential mechanical resonator and configured to receive the differential output signal and generate a phase-shifted differential signal, the processing circuit further configured to provide the phase-shifted differential signal to a differential input of the differential mechanical resonator,
wherein the phase shifter comprises:
  a first input port;
  a second input port, wherein the first and second input ports are configured to receive the differential output signal; and
  three output ports configured to provide three respective output signals of substantially equal amplitude and different phase,
wherein the phase shifter comprises an RC network including a fixed value resistor and a fixed value capacitor,
wherein a first terminal of the resistor is connected to a first terminal of the capacitor and to a first of the three output ports of the phase shifter,
wherein a second terminal of the resistor is coupled to the first input port of the phase shifter and a second of the three output ports of the phase shifter,
wherein a second terminal of the capacitor is coupled to the second input port of the phase shifter and a third of the three output ports of the phase shifter,
wherein the resistor has a resistance value approximately equal to a negative reactance of the capacitor.

28. A device, comprising:
a differential mechanical resonator having an output and configured to produce a differential output signal; and
a processing circuit comprising a phase shifter coupled directly to the output of the differential mechanical resonator and configured to receive the differential output signal and generate a phase-shifted differential signal, the processing circuit further configured to provide the phase-shifted differential signal to a differential input of the differential mechanical resonator,
wherein the phase shifter comprises:
  a first input port;
  a second input port, wherein the first and second input ports are configured to receive the differential output signal; and
  three output ports configured to provide three respective output signals of substantially equal amplitude and different phase,
wherein the phase shifter does not include a variable capacitor.

* * * * *